US009444049B2

(12) United States Patent
Headrick

(10) Patent No.: US 9,444,049 B2
(45) Date of Patent: Sep. 13, 2016

(54) METHODS FOR FORMING ONE OR MORE CRYSTALLINE LAYERS ON A SUBSTRATE

(71) Applicant: University of Vermont and State Agricultural College, Burlington, VT (US)

(72) Inventor: Randall L. Headrick, Burlington, VT (US)

(73) Assignee: University of Vermont and State Agricultural College, Burlington, VT (US)

( * ) Notice: Subject to any disclaimer, the term of this patent is extended or adjusted under 35 U.S.C. 154(b) by 0 days.

(21) Appl. No.: 14/412,846

(22) PCT Filed: Jul. 3, 2013

(86) PCT No.: PCT/US2013/049320
§ 371 (c)(1),
(2) Date: Jan. 5, 2015

(87) PCT Pub. No.: WO2014/008395
PCT Pub. Date: Jan. 9, 2014

(65) Prior Publication Data
US 2015/0194605 A1 Jul. 9, 2015

Related U.S. Application Data

(60) Provisional application No. 61/667,623, filed on Jul. 3, 2012, provisional application No. 61/786,988, filed on Mar. 15, 2013.

(51) Int. Cl.
*H01L 51/00* (2006.01)
*C30B 7/00* (2006.01)
(Continued)

(52) U.S. Cl.
CPC .......... *H01L 51/0003* (2013.01); *C30B 7/005* (2013.01); *C30B 29/54* (2013.01);
(Continued)

(58) Field of Classification Search
CPC .......... H01L 51/0094; H01L 51/0003; H01L 51/0036; H01L 51/0047; H01L 51/0055; H01L 51/0074; H01L 51/0558; H01L 51/0012; H01L 51/0058; C30B 29/54; C30B 7/005
See application file for complete search history.

(56) References Cited

U.S. PATENT DOCUMENTS 6,265,243 B1   7/2001   Katz et al.
7,389,689 B2   6/2008   Wargo et al.
(Continued)

FOREIGN PATENT DOCUMENTS

EP        0482207       7/1996
KR     20120063954      6/2012

OTHER PUBLICATIONS

Kiyomura et al., Epitaxial growth of pentacene thin-film phase on alkali halides, Thin Solid Films, vol. 515, Issue 2, pp. 810-813. Oct. 25, 2006.

(Continued)

*Primary Examiner* — Whitney T Moore
(74) *Attorney, Agent, or Firm* — Hodgson Russ LLP

(57) ABSTRACT

A method for forming a crystalline film of a material is provided, including depositing a solution, having a base critical speed separating deposition regimes, on a substrate such that a crystalline film is formed. The solution is deposited at a speed greater than the base critical speed and the crystalline film has a crystal structure characteristic of a crystalline film formed from the solution at a speed less than the base critical speed. In another aspect, a crystalline film is formed on a base film by depositing a solution on the base film. The solution has a critical speed between deposition regimes, and the solution is deposited at a speed greater than or equal to the critical speed, such that a crystalline film is formed on the base film. A device is disclosed, the device having a film made from any of the disclosed methods and an electrical lead.

16 Claims, 15 Drawing Sheets

(51) Int. Cl.
*C30B 29/54* (2006.01)
*H01L 51/05* (2006.01)

(52) U.S. Cl.
CPC ....... *H01L51/0012* (2013.01); *H01L 51/0036* (2013.01); *H01L 51/0047* (2013.01); *H01L 51/0074* (2013.01); *H01L 51/0094* (2013.01); *H01L 51/0055* (2013.01); *H01L 51/0558* (2013.01)

(56) References Cited

U.S. PATENT DOCUMENTS

| | | |
|---|---|---|
| 2002/0160103 A1 | 10/2002 | Fukunaga et al. |
| 2004/0126711 A1 | 7/2004 | Hill et al. |
| 2008/0138927 A1 | 6/2008 | Headrick |
| 2010/0290945 A1 | 11/2010 | Ma et al. |
| 2012/0067424 A1 | 3/2012 | Fujdala et al. |
| 2012/0091436 A1 | 4/2012 | Forrest et al. |

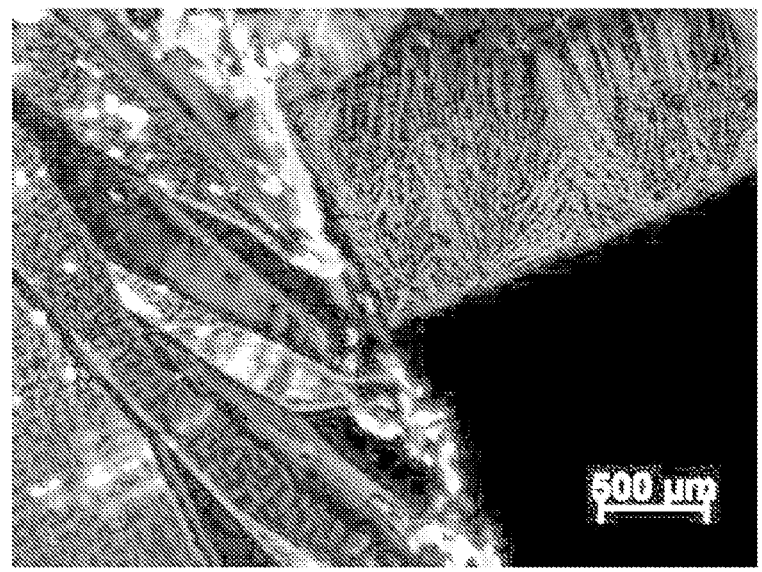
Fig. 8
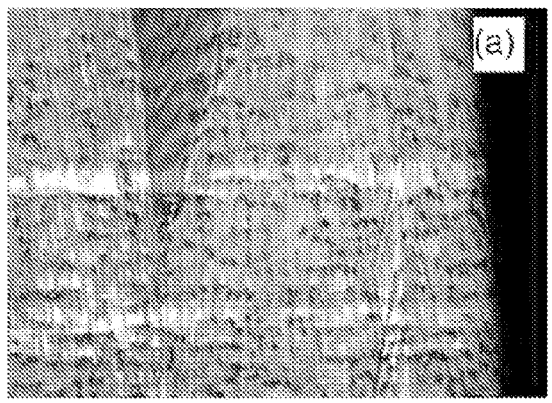 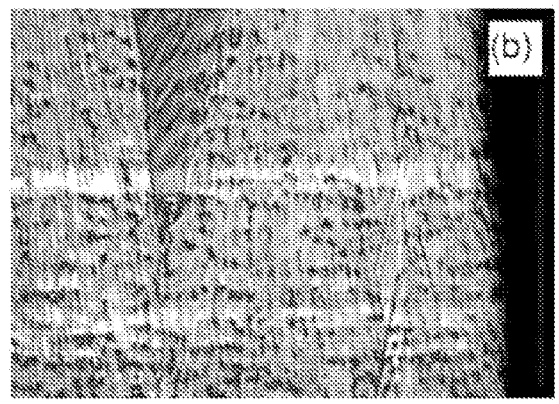
Fig. 9A　　　　　　　　　　Fig. 9B
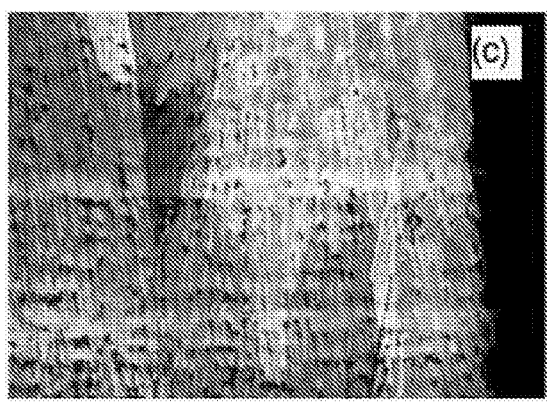 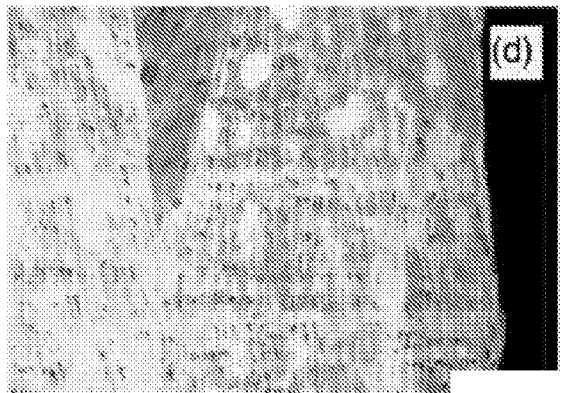
Fig. 9C　　　　　　　　　　Fig. 9D

METHODS FOR FORMING ONE OR MORE CRYSTALLINE LAYERS ON A SUBSTRATE

CROSS-REFERENCE TO RELATED APPLICATIONS

This application claims priority to U.S. Provisional Application No. 61/667,623, filed on Jul. 3, 2012, now pending, and U.S. Provisional Application No. 61/786,988, filed on Mar. 15, 2013, now pending, the disclosure of which applications are incorporated herein by reference.

STATEMENT REGARDING FEDERALLY SPONSORED RESEARCH

This invention was made with government support under contract no. DMR-0722451 awarded by the National Science Foundation. The government has certain rights in the invention.

FIELD OF THE INVENTION

The invention relates to methods of manufacturing thin films and devices using thin films, such as organic thin film semi-conductor devices.

BACKGROUND OF THE INVENTION

Thin films deposited from solution by high throughput processes (>1 mm/s) generally have small crystalline grain size and, therefore, are adversely affected by the properties of grain boundaries. As a result, such films typically have lower electronic carrier mobility and larger charge trap densities compared to films with large crystalline grain size, and are thus less useful for many electronic applications.

In prior art, the dominant method of increasing the crystallinity (e.g., increasing the crystalline grain size) of solution-processed thin films is to reduce solvent evaporation by enclosing the surface during or after the solution deposition in order to reduce the rate of solvent evaporation and thus slow down the drying process. However, this process is difficult to scale to a high throughput process.

Additionally, the deposition of multiple thin film layers from solution cannot be easily accomplished by previous solution processing methods because each solution layer damages or completely dissolves the layer beneath. Solution-based methods used in the production of, for example, organic electronics, organic photovoltaics, and organic light emitting diodes are thus limited in how many layers can be effectively stacked. Typical processes include drop casting, spin processing, blade coating, slot-die coating, and various printing methods. The current state of the art for solution-processed films is to deposit only a single soluble layer. In the case of organic photovoltaics, two materials are mixed within such a single layer, and natural phase separation causes the materials to separate into a complex nanomorphology, known as a bulk heterojunction ("BHJ"). However, the nanomorphology obtainable by natural phase separation is known to be far from optimal. In other markets, where nearly planar interfaces are preferred and/or where materials do not readily phase separate with the correct nanomorphology (such as, for example, organic transistors, light emitting diodes), deposition methods resulting in BHJs are not appropriate.

Other approaches to solving this problem have previously been developed by making use of the different solubilities of specific materials, i.e., cases where solvent #1 is used to deposit layer #1 and solvent #2 for layer #2, and the material of layer #1 is chosen such that solvent #2 does not significantly dissolve or damage it. In some cases, the material of layer #1 is engineered in such a way as to change from a soluble material to a material that is insoluble, for example, to polymerize during a heating step. These methods depend on specific choices of the materials and solvents, and demand that material #1 have properties that are fairly novel.

Therefore, based on at least the foregoing, there is a need for solution-based high-throughput deposition methods which yield thin films having large crystalline grain size and/or multiple film layers.

BRIEF SUMMARY OF THE INVENTION

The present invention may be embodied as a method for forming a crystalline film of a material, comprising the step of depositing a solution on a substrate such that a crystalline film is formed. The film may be a semiconductor. The solution comprises precursor molecules, and the solution has a base critical speed between a convective regime and an LLD regime. The solution is deposited at a speed greater than the base critical speed and the crystalline film has a crystal structure characteristic of a crystalline film formed from the solution at a deposition speed less than the base critical speed. The present invention may be embodied as a device comprising a crystalline film made by such method and one or more electrical leads in electrical communication with the crystalline film.

The crystalline film may have crystalline domains with a size greater than those of a crystalline film formed by the solution at a deposition speed less than the base critical speed.

In some embodiments, the substrate has one or more layers and the solution is deposited on an outermost layer. The solution may have a concentration of 0.01 wt. % to 50 wt. %, inclusive. In some embodiments, the substrate has a temperature greater than 0° C.

Exemplary precursor molecules are: 6,13-bis(triisopropylsilylethynyl)pentacene (TIPS pentacene), Dicyano-6,13-bis-(triisopropylsilylethynyl)pentacene (2,3-CN2-TIPS-Pn), 2,7-dioctyl[1]benzothieno[3,2-b][1]benzothiophene (C8-BTBT), poly(3-hexylthiophene) (P3HT), and 1-(3-methoxycarbonyl)propyl-1-phenyl[6,6]C61 (PCBM).

The present disclosure may be embodied as a method for forming a crystalline film on a base film disposed on a substrate, comprising the step of depositing a solution comprising precursor molecules on the base film. The film may be a semiconductor. The solution has a critical speed between a convective regime and an LLD regime, and the solution is deposited at a speed greater than or equal to the critical speed, such that a crystalline film is formed on the base film. The present invention may be embodied as a device comprising a crystalline film made by such method and one or more electrical leads in electrical communication with the crystalline film. In some embodiments, the base film is a template crystalline film and the crystalline film is an epitaxial crystalline film.

The solvent of the solution may be selected such that the template crystalline film will at least partially dissolve during deposition of the solution. The template crystalline film may comprise a material different from a material of the epitaxial crystalline film formed by the solution. In some embodiments, the solution is deposited at a speed such that the pre-exiting crystalline film and the epitaxial crystalline film form a layer having a graded composition. In some embodiments, the solution has a concentration greater than half of the solubility limit of the precursor molecules. In some embodiments, the solution has a concentration less than or equal to half of the solubility limit of the precursor molecules.

Exemplary precursor molecules are: 6,13-bis(triisopropylsilylethynyl)pentacene (TIPS pentacene), Dicyano-6,13-bis-(triisopropylsilylethynyl)pentacene (2,3-CN2-TIPS-Pn), 2,7-dioctyl[1]benzothieno[3,2-b][1]benzothiophene (C8-BTBT), poly(3-hexylthiophene) (P3HT), and 1-(3-methoxycarbonyl)propyl-1-phenyl[6,6]C61 (PCBM).

DESCRIPTION OF THE DRAWINGS

For a fuller understanding of the nature and objects of the invention, reference should be made to the following detailed description taken in conjunction with the accompanying drawings described below.

FIG. 8 Polarized optical micrographs: Crossing lines of TIPS-Pentacene. The image shows the intersection of two 5 mm wide lines of TIPS-Pentacene. The first line is on the left side of the image and was written from bottom to top at 0.08 mm/s. The second line is oriented at 90 degrees to the first and has a much smaller grain size than the first in the area where the two lines do not overlap because of the higher speed (25 mm/s) However in the region of overlap, the grain structure of the second layer is observed to take on the same overall structure as the underlying first layer.

FIG. 9A-9D: Second layer crystallization of TIPS-Pentacene. Frames from a polarized optical microscope video covering about 3 seconds elapsed time. Initially, a crystalline film of TIPS-Pentacene with large grain size was deposited. Frame (9A) shows the film under crossed polarizers to highlight the crystalline grain structure. At this time, the film has already been coated with a thin layer of solution, which is nearly transparent. Initially, film #1 is somewhat discontinuous with thinner regions visible as dark spots. Frame (9B) shows that the dark spots increase in size, indicating minimal elution of the lower film while the upper film remains in a liquid state. Frame (9C) shows the transition of layer #2 to a crystalline state, covering about half of the visible area. It is visible as a lighter shade encroaching from the top right of the image. Frame (9D) shows the final structure after complete crystallization of the upper film. The field of view in each frame is 2 mm horizontally.

DETAILED DESCRIPTION OF THE INVENTION

Unless otherwise indicated, all percent composition values are given in terms of wt. %. The terms "film" is used herein as equivalent to a "thin film."

Processes for depositing individual or sequential multiple thin layers of molecules from liquid solution are disclosed. The properties of the films produced depend, at least in part, on a "critical speed" which divides two deposition speed regimes—the lower "convective regime," and the higher "Landau-Levich-Deryaguin" ("LLD") regime. The critical speed for a given solution is dependent on, at least in part, the environmental conditions, such as, for example, the temperature, during deposition.

Figure 1A:
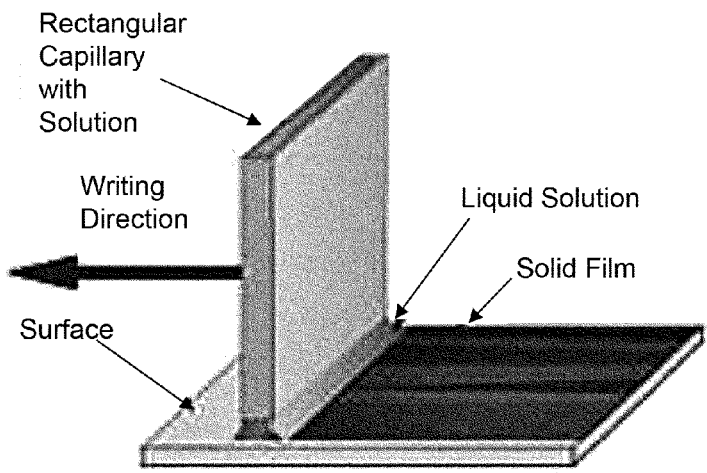
FIG. 1A is a diagram of an exemplary apparatus for solution-based deposition of thin films.
Figure 2A:
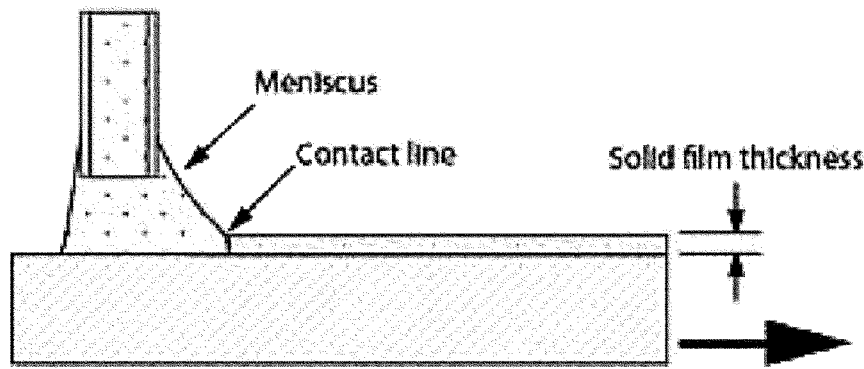
FIG. 2A is a diagram illustrating the make-up of the material during deposition in the convective regime, wherein at such speeds below the critical speed, a well-defined contact line between the liquid solution and solid film are maintained, resulting in a crystalline film having large crystalline grain size.
Figure 2B:
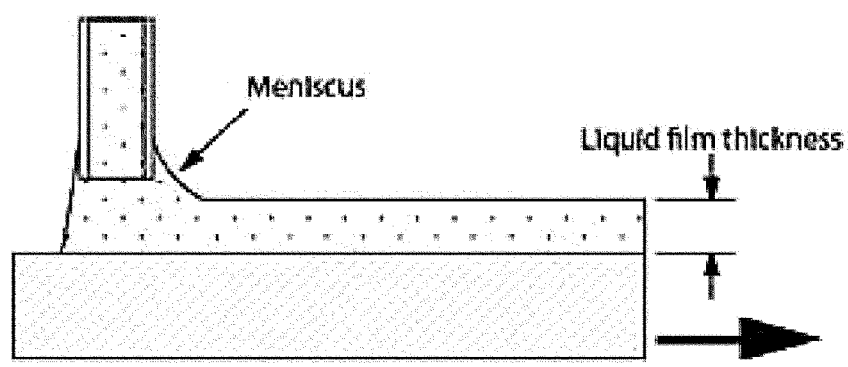
FIG. 2B is a diagram illustrating the make-up of the material during deposition in the LLD regime, wherein at such speeds above the critical speed, the meniscus is stretched until it coats a large area before drying can take place, resulting in a crystalline film having small crystalline grain size.
Figure 3:
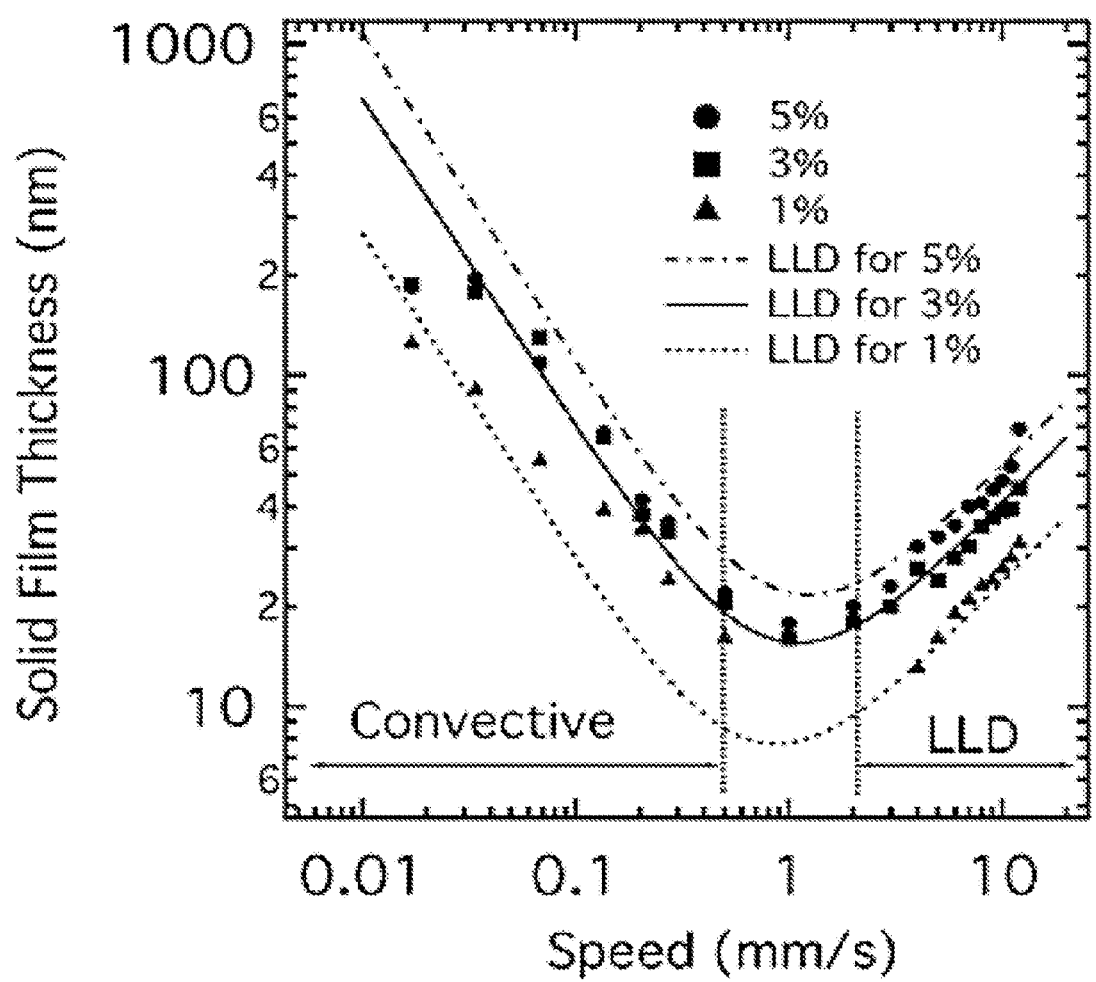
FIG. 3 shows film thickness vs. writing speed for a deposition at room temperature.
Figure 4A:
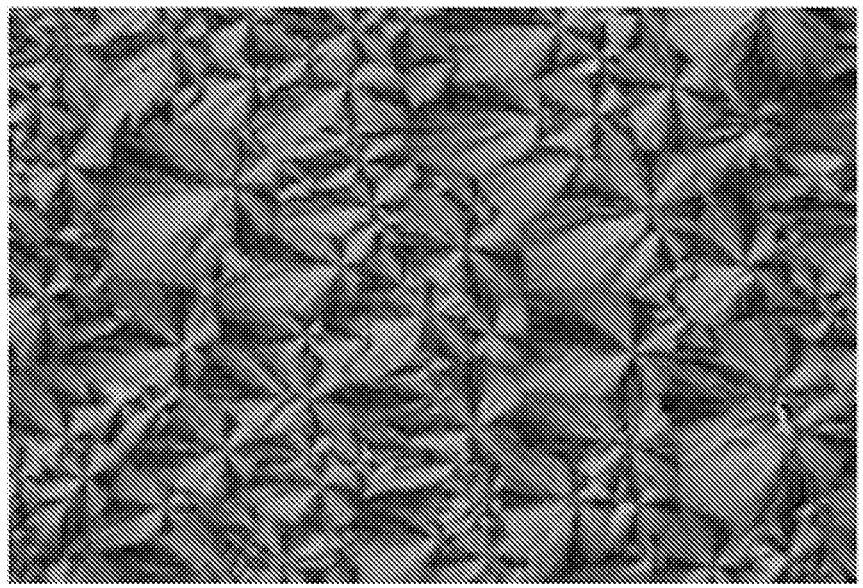
FIG. 4A is an exemplary polarized optical microscopy image of a portion of a 5 mm wide line of 3% solution of TIPS-Pentacene in toluene written at 4 mm/s at room temperature.
Figure 4B:
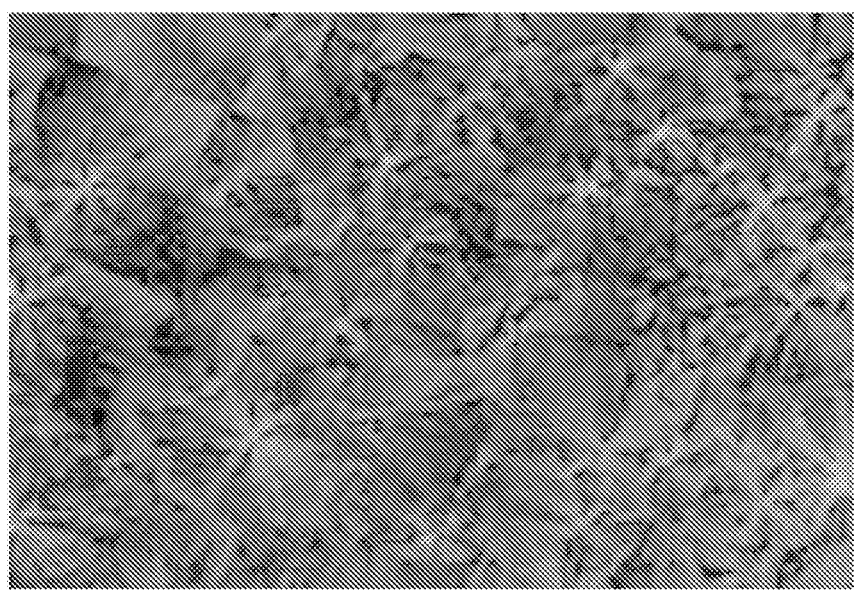
FIG. 4B is an exemplary polarized optical microscopy image of a portion of a 5 mm wide line of 5% solution of TIPS-Pentacene in toluene written at 12 mm/s at room temperature.

Deposition of a single film layer by capillary writing is illustrated in FIGS. 1A, 2A and 2B. The exemplary apparatus depicted in FIG. 1A shows a substrate onto which a film is deposited, a solution comprising the precursor molecules to be crystallized, and a hollow pen containing the solution. FIG. 2A depicts wherein the apparatus of FIG. 1A is used to deposit the solution at a speed v that is less than the critical speed $v_c$—i.e., in the convective regime. For example, the critical speed $v_c$ of 1-5% TIPS-Pentacene in toluene, is 1 mm/s at standard temperature and pressure ("STP"), see FIG. 3. For low speeds, $v<v_c$, the resulting film is created at a three-phase contact line between the liquid solution, solid substrate, and vapor phase Films written on substrates in the LLD regime $v>v_c$ exhibit different properties: the grain size is smaller and the grains are isotropic rather than elongated along the writing direction (see, e.g., FIGS. 4A-4B, showing spherulitic grains with 100 micrometer length scale in the exemplary deposition samples). This structure can be described as "spherulitic" because each grain extends out in all directions from a central nucleation point. Depending on the application, it is often beneficial to deposit films in the convective regime in order to achieve larger grain size.

At higher speeds, $v>v_c$, the surface is coated with a thin liquid solution layer which subsequently dries in a controlled manner, as illustrated in FIG. 2B. FIG. 3 illustrates how the thickness of the final solid film depends on the coating speed in this LLD regime, where the thickness increases with increasing speed. This is a result of viscous forces within the solution, which become larger at higher speeds. The critical speed $v_c$ is defined as the speed at which the minimum film thickness occurs. In FIG. 3, the critical speed $v_c$ is 1 mm/s. An alternative estimate of $v_c$ can be obtained from the end of the convective regime where the well-defined contact line breaks down, see FIG. 2A. This technique for determining critical speed is easier to perform experimentally, since it does not require accurate measurement of the film thickness.

Techniques of the present disclosure allow for high throughput for deposition of multilayered and/or graded structures, and the ability to produce highly crystalline layers with high throughput (e.g., speeds ranging from 0.001 m/min to 1000 m/min, including all values to the 0.005 m/min and ranges therebetween). In one aspect of the present disclosure, methods involve shifting the critical speed (relative to the critical speed at standard temperature and pressure (the "base critical speed")) such that deposition at higher speeds will still yield crystalline films with crystal structures characteristic of films formed at the lower speeds of the prior methods. The base critical speed may be the critical speed at any selected environmental conditions. For example, in some embodiments, the base critical speed is the critical speed at STP. In other embodiments, the base critical speed is the critical speed at room temperature. In other embodiments, the base critical speed may be defined as the critical speed at the environmental conditions conventionally used for a particular deposition process used to perform the methods of the present disclosure.

In an example of 1-5% TIPS-Pentacene in toluene, deposition speeds greater than its base critical speed at STP of 1 mm/s can be used. Such high-speed methods with shifted critical speeds advantageously produce films having larger crystalline grain size, and correspondingly improved carrier mobility, as compared to the films produced using previously known methods at the same high speed.

Figure 5A:
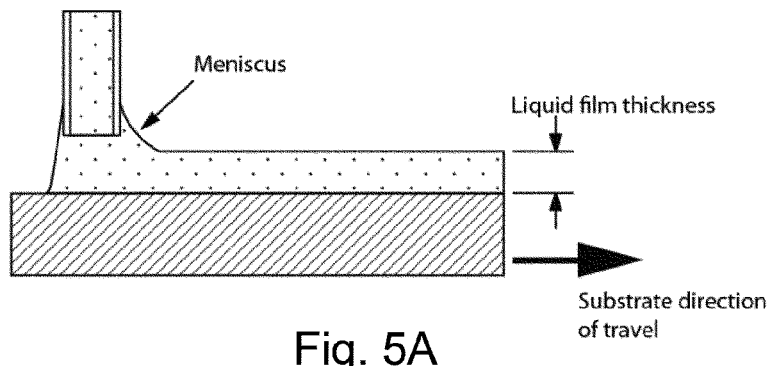
FIG. 5A-5C are process diagrams illustrating exemplary methods to achieve convective crystallization at higher speeds, e.g., by shifting the critical speed $v_c$ higher. Depicted are films written at the same speed v. In (5A) the meniscus is stretched until it coats a large area before drying can take place. Film crystallization occurs in the LLD regime; since $v > v_c$, there is no contact line. In (5B) the solution is heated thus increasing the vapor pressure of the solvent; a well-defined contact line between the liquid solution and solid film are maintained and the critical speed is shifted up. The two regimes result in dramatically different grain structures. Note that the critical speed $v_c$ is varied rather than the speed v as in FIG. 3. In (5C) an alternative method is depicted where the contact line is established by a gas jet. In this method, the meniscus is extended by the distance d between the writing capillary and the gas jet. The evaporation rate of the solvent is increased by impingement of a (typically inert) gas to carry solvent vapor away. The gas may also be heated in order to further increase the evaporation rate.
Figure 5B:
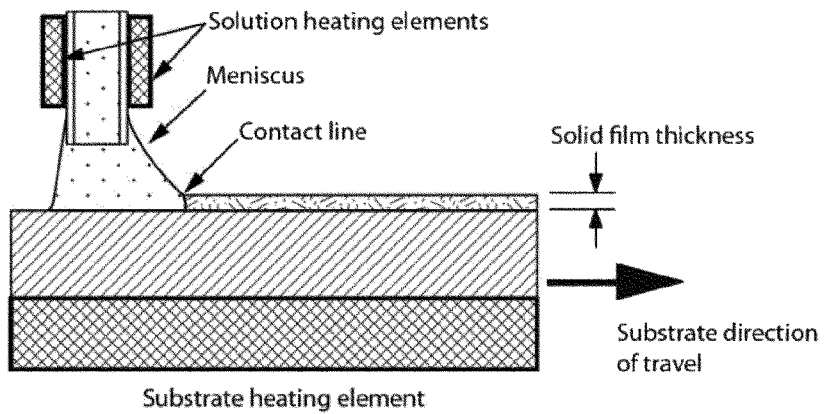
Figure 5C:
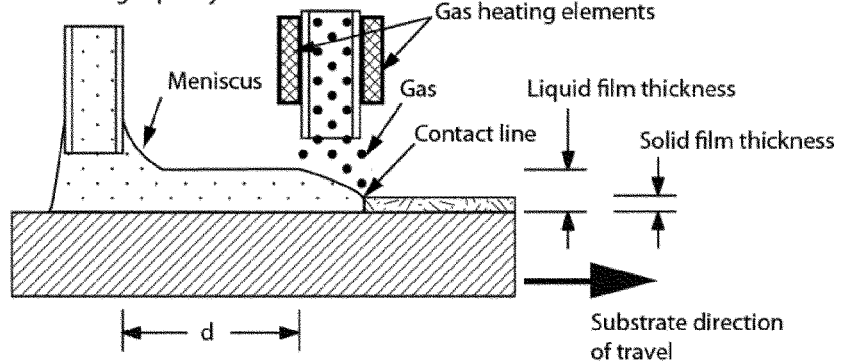

The critical speed can be shifted by changing properties of the solution such as, for example, the vapor pressure or the viscosity. Generally, a higher vapor pressure and a lower viscosity will shift the critical speed higher. This can be accomplished in a variety of ways for a given solvent, such as by increasing the temperature of the solution and/or heating the substrate (see, e.g., FIG. 5B). Drying the solution using a heated or unheated gas jet will have a similar effect (see, e.g., FIG. 5C). In an exemplary embodiment of the present disclosure, a film was produced by deposition on a heated substrate at speeds greater than 2 mm/s. The resulting film had a larger crystalline grain size and higher charge carrier mobility comparable to room temperature deposition (<0.2 mm/s) In some embodiments, the critical speed can be shifted by selection of a solvent having a higher vapor pressure than the initial solvent. In such embodiments, the solution having a replacement solvent is deposited at a speed which is greater than the critical speed of the original solution.

Figure 19:
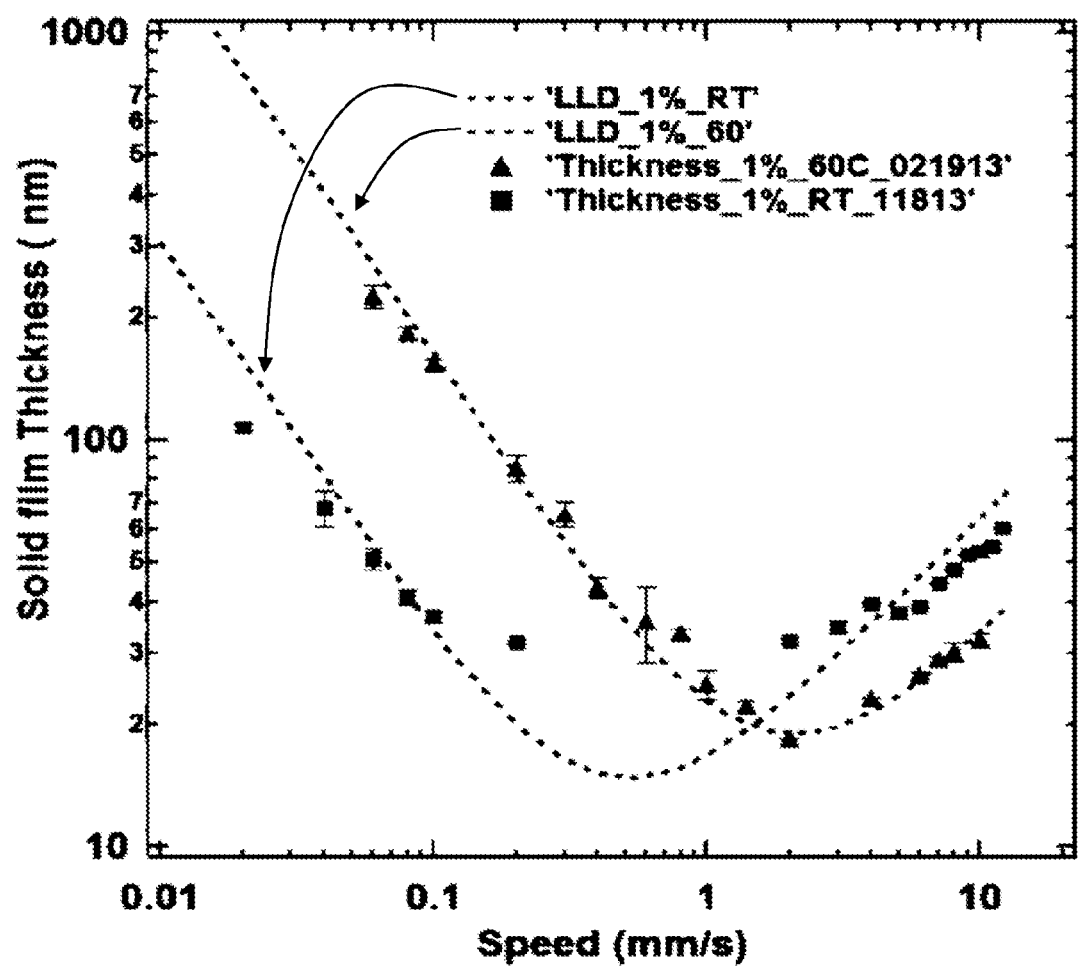
FIG. 19: Example of TIPS pentacene film thickness vs. writing speed at different substrate temperatures. In the convective regime, film thickness at 60° C. is four times as that of the RT thickness, due to the higher solvent vapor pressure. With the increase in the deposition temperature, the vapor pressure of toluene increases from 5.4 kPa at RT to 28 kPa at 60° C. and hence causes a dramatic increase in the thickness of the films. The thickness of the films in the LLD regime are less at higher temperature, due to a decrease in the viscosity of the solution. The dashed lines represent a model for the transition from convective to LLD regimes. Example of C8-BTBT Organic Field Effect Transistor characteristics. (left) Output characteristics; (right) transfer characteristics. Devices were fabricated with an $SiO_2$ dielectric and gold source and drain contacts in a top contact geometry. Channel length (width) are 100 (1000) micrometers. This exemplary device is fabricated from a film written from a 1 wt. % solution in toluene at 0.1 mm/s. The carrier mobility determined from the transfer curve is 5.0 $cm^2$/V-s.

The thickness of organic semiconductor thin films can be controlled by the substrate speed, concentration, and deposition temperature. There are two distinct thickness regimes that depend on the substrate speed. In the slower speed convective regime, the film is typically formed with large grain size and the film thickness decreases as substrate speed increases. However, at faster speeds in the LLD regime, the viscous force applied on the solution "pulls out" the solution and leaves a steady liquid film behind that dries afterwards. In this regime, the thickness of the resulting film increases with the substrate speed according to a power law. Increasing the substrate and/or solution temperature leads to an increase of the solvent vapor pressure and a decrease of the viscosity of the solution (see, e.g., FIG. 19). Both effects tend to shift the critical speed higher. Note that these effects could also be achieved by using a solvent with a different vapor pressure and/or a different viscosity without varying the temperature.

The present disclosure may be embodied as a method 100 for forming a crystalline film of a semiconductor material. The method 100 comprises the step of depositing 103 a solution on a substrate such that the crystalline film is formed on the substrate. The substrate is an arbitrary substrate, and need not be a crystalline substrate. The substrate can be planar or curved. The substrate has a suitable surface roughness, and surface tension and surface wetting with respect to the precursor solution, such that the film or films can be formed on the substrate. The substrate may be monolithic, monolithic with other films disposed on it, or comprised of a plurality of layers. The solution comprises precursor molecules—i.e., molecules that can crystallize as the solution dries into a film. The solution has a base critical speed between a convective regime and an LLD regime, as described above. The solution is deposited 103 at a speed that is faster than the base critical speed of the solution, and the resulting crystalline film has a crystal structure characteristic of a crystalline film formed using the same solution at a deposition speed less than the base critical speed. In this manner, a crystalline film with large crystal grain size (grain size characteristic of films formed at $v<v_c$) can be formed at a high speed. It should be noted that the crystal structure need not be identical to the structure observed in a film formed at $v<v_c$, but that the crystal structure exhibit similar characteristics (e.g., large crystalline grain size). The crystalline film may have crystalline domains with a size greater than those of a crystalline film formed using the solution at a deposition speed less than the base critical speed. In various embodiments, the crystalline grain size is at least 50%, 100%, 150%, or 200% larger than the grain size obtained at the same speed without a shifted critical speed, and/or the film has at least partial crystallographic alignment with respect to the writing direction.

The method 100 may be performed where the substrate has one or more layers and the solution is deposited 103 on the outermost layer. The concentration of the solution may vary. In some embodiments, the solution has a concentration of 0.01 wt. % to 50 wt. %, inclusive. In some embodiments, the substrate has a temperature of greater than 0° C. In some embodiments, the substrate has a temperature of greater than 20° C., 25° C., or 30° C.

The precursor molecules may be small molecules or polymers that have solubility and stability such that they can be deposited by the methods described herein to provide crystalline films. In an embodiment, the small molecule or polymer is an organic semiconductor and provides a film having semiconducting properties. Examples of suitable small molecules include pentacene, phthalocyanine, porpyrin, perylene, triphenylene, hexabenzocoronene, C60, and [1]benzothieno[3,2-b]benzothiophene (BTBT) and derivatives thereof (e.g., derivatives having groups that provide solubility in an organic solvent and/or pack into a crystal structure with favorable electronic carrier transport properties for electrons (in the case of n-type materials, also known as "acceptors") or for holes (in the case of p-type materials, also known as "donors"). The precursor molecules may be 6,13-bis(triisopropylsilylethynyl)pentacene (TIPS pentacene), Dicyano-6,13-bis-(triisopropylsilylethynyl)pentacene (2,3-CN2-TIPS-Pn), 2,7-dioctyl[1]benzothieno[3,2-b][1]benzothiophene (C8-BTBT), poly(3-hexylthiophene) (P3HT), and/or 1-(3-methoxycarbonyl)propyl-1-phenyl[6,6] C61 (PCBM). Examples of suitable n-type derivatives include the following cyanopentacenes:

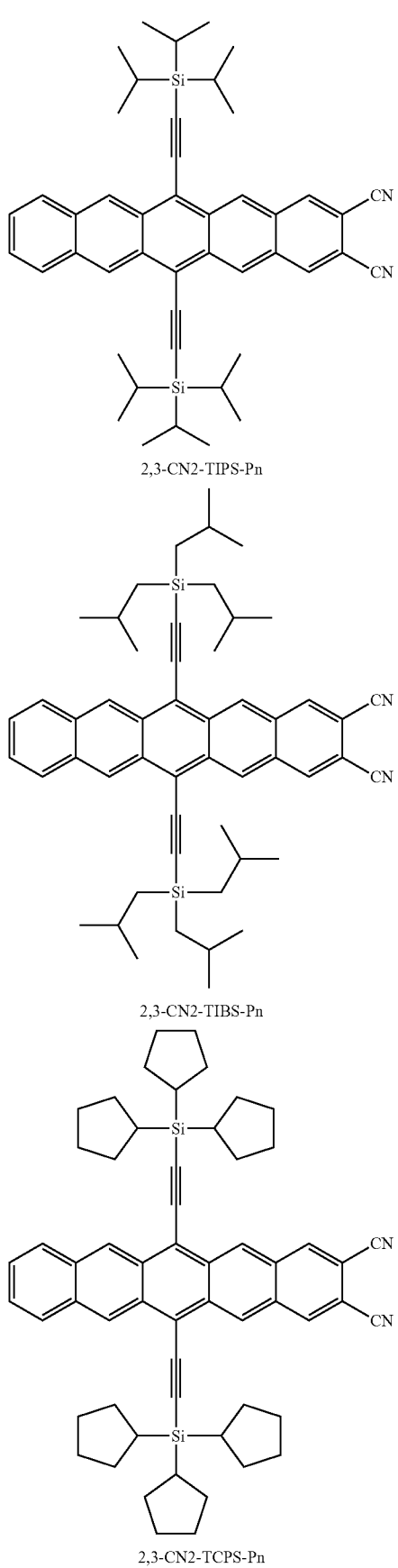
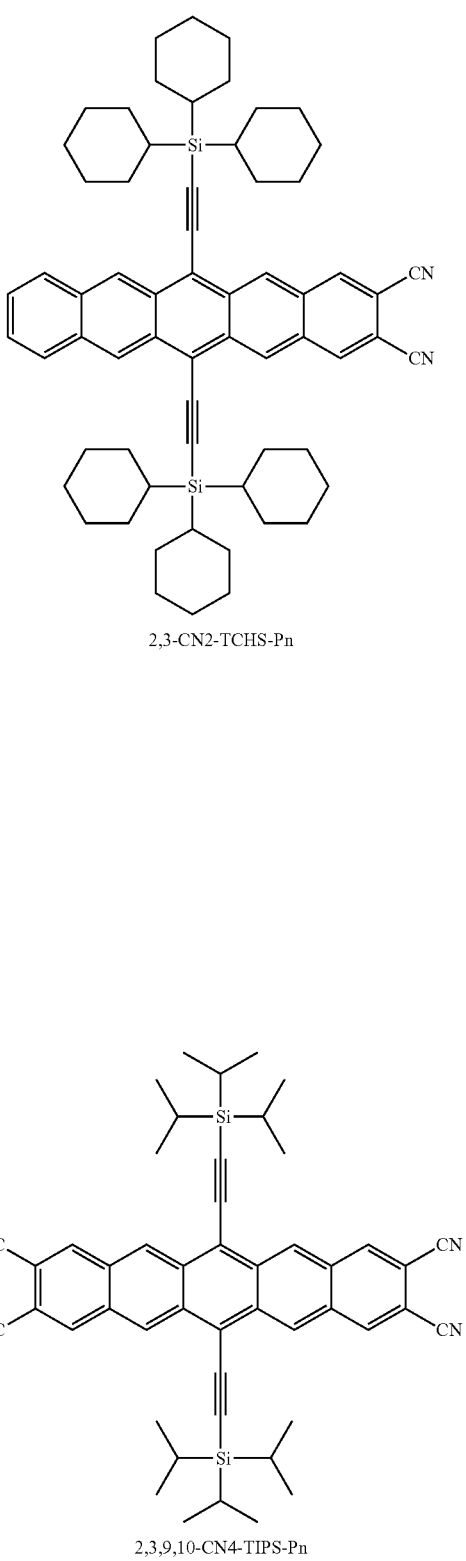

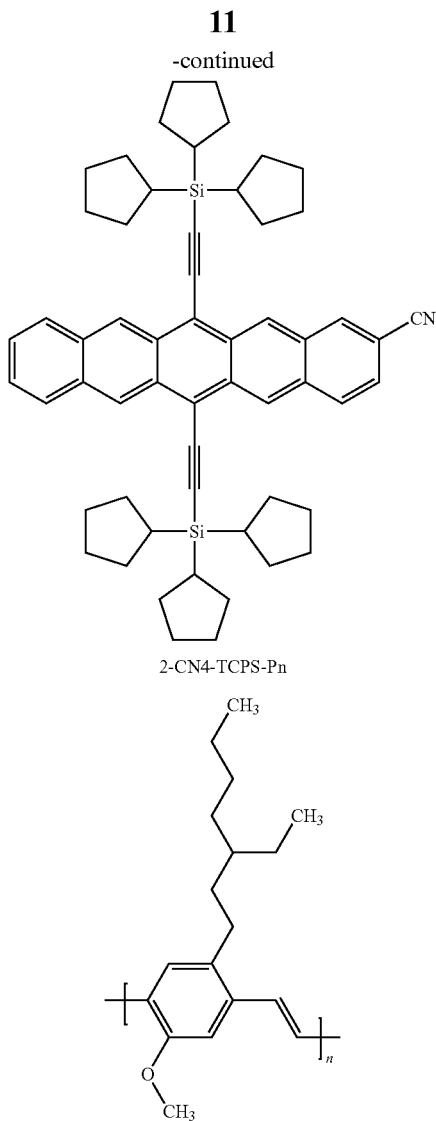

2-CN4-TCPS-Pn

Examples of suitable polymers include poly(3-hexylthiophene), poly(phenylene vinylene) (PPV), NC-PPV, polyacetalene, and poly[2-methoxy-5-(2'-ethylhexyloxy)-p-phenylene vinylene] (MEH-PPV). Additional examples of suitable precursors that may be used in photovoltaic applications include the following:

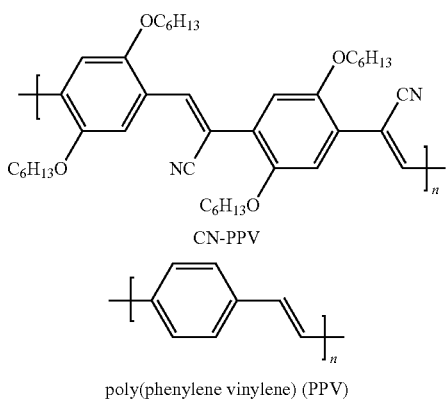

CN-PPV poly(phenylene vinylene) (PPV)

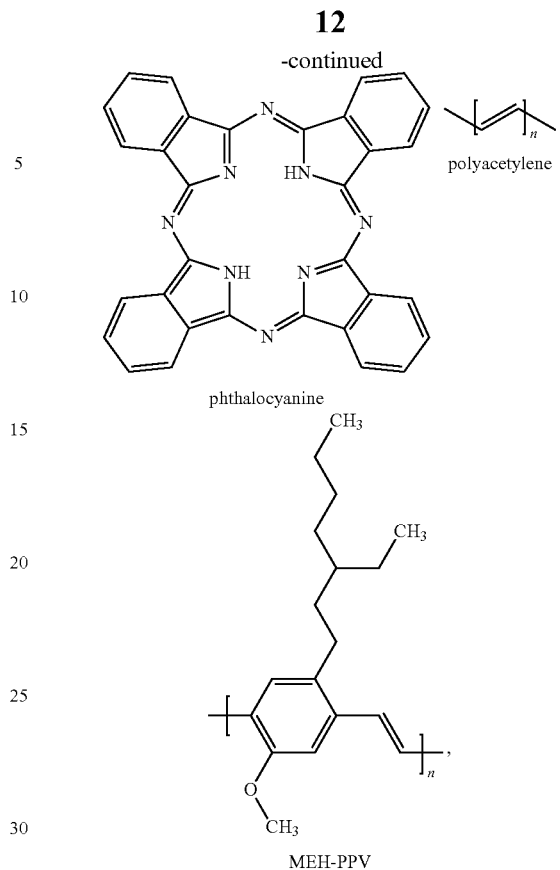

phthalocyanine polyacetylene

MEH-PPV which may be used in photovoltaic applications. The polymers may crystallize such that they have crystalline regions and amorphous regions and exhibit semiconducting properties. Nanotubes (e.g., semiconducting carbon nanotubes) and nanowires (e.g., ZnO nanowires) may also be used as precursors. Due to their large aspect ratio they can be aligned in order to produce improved electronic transport along the direction of alignment.

In another aspect of the present disclosure, a general method for solution-based multilayer deposition is described based on sequential deposition of layers at speeds in the LLD regime. It was found that when solution is applied to a substrate with a speed larger than the critical speed and with a sufficiently concentrated solution, the solution does not significantly damage or disturb underlying soluble layers. The LLD regime may be more suited to production of stacked film layers, because the formation of multiple layers requires the liquid solution to be spread into a thin layer quickly before the layer beneath is damaged by the larger volume of solution in the region near the meniscus. Such multiple layer ("multilayer") films can be produced resulting in several useful embodiments:

a) Multiple layers of a material having a crystalline phase film can be built up. If the lower films are crystalline or have a crystalline grain structure, then a subsequent, adjacent film takes on a similar crystalline grain structure. This additive crystallization process is an example of epitaxy (from the Greek epi "above" and taxis "in ordered manner"). This process is not limited by speed, i.e., as long as $v > v_c$, the speed is only limited by the mechanical device producing the motion.

b) Multiple film layers can be built up using two or more materials. In cases where the materials have similar crystalline structures, heteroepitaxy, i.e., epitaxy between two different crystalline materials, can be accomplished.
  c) Multiple film layers can be built up with a graded composition. If two or more materials are mixed in solution, then the composition can be graded by gradually varying the composition in subsequent films.
  d) Additional variations of the above structures can be accomplished by choosing the concentration of the upper film solution(s) in order to intentionally cause the lower film to partially re-dissolve. This creates a mixed interface with nanomorphology that is desirable in some applications (e.g., organic photovoltaic cells).

The present invention may be embodied as a method 200 for forming an epitaxial crystalline film on a template crystalline film (e.g., a pre-existing film) disposed on a substrate. The method 200 comprises depositing 203 a solution on the template crystalline film. The solution comprises precursor molecules—i.e., molecules that can crystallize as the solution dries into a film. The solution has a critical speed between a convective regime and an LLD regime, as described above. The solution is deposited 203 at a speed in the LLD regime—a speed faster than the critical speed of the solution. In this manner, a crystalline layer is formed at a high deposition speed, and the crystalline layer is epitaxial.

The resulting epitaxial crystalline film has a crystal structure characteristic of the underlying crystalline film on which it is formed. It should be noted that the crystal structure of the epitaxial film need not be identical to the structure of the underlying crystalline film, but that the crystal structure exhibit similar characteristics (e.g., packing density, "herringbone" or "slip-stacked" packing motif, Bravais lattice type, crystal space group, unit cell dimensions, and combinations thereof). Additionally, by "similar characteristics" it is meant that that the crystal structure of the epitaxial film may have a structure that is distorted by strain and may have a lower symmetry. In various embodiments, one or more axis of the crystal structure of the epitaxial film is different by 5% or less, 4% or less, 3% or less, 2% or less, or 1% or less from the underlying crystalline film.

The solvent of the solution may be selected such that the template crystalline film will at least partially dissolve during the deposition 203 of the solution. In some embodiments, the template crystalline film is comprised of a material different from the material of the epitaxial crystalline film formed by the solution. As such, where the solution forms a crystalline film which is different than the material of the template crystalline film, and where the template film is at least partially dissolved during deposition 203 of the solution, the template crystalline film and the epitaxial crystalline film form a layer having a graded composition—e.g., a gradient from the material of the template crystalline film to the material of the epitaxial crystalline film. The graded composition may have a linear composition gradient or a non-linear composition gradient through at least a portion of the depth of the films (e.g., template film and crystalline film).

The solution may have a concentration greater than half of the solubility limit of the precursor molecules. In other embodiments, the solution may have a concentration less than half of the solubility limit of the precursor molecules. The precursor molecules can be any of those described herein.

Additional approaches for depositing multiple film layers from solution have been developed for certain applications, e.g., photographic film, where multiple stacked layers are deposited as liquid precursor solutions and dry simultaneously via methods such as curtain coating, slide coating, or multiple-slot-die coating. These methods are more complex than the sequential deposition method described in this disclosure and their advantages relative to the disclosed method are minimal in most cases.

Figure 6A:
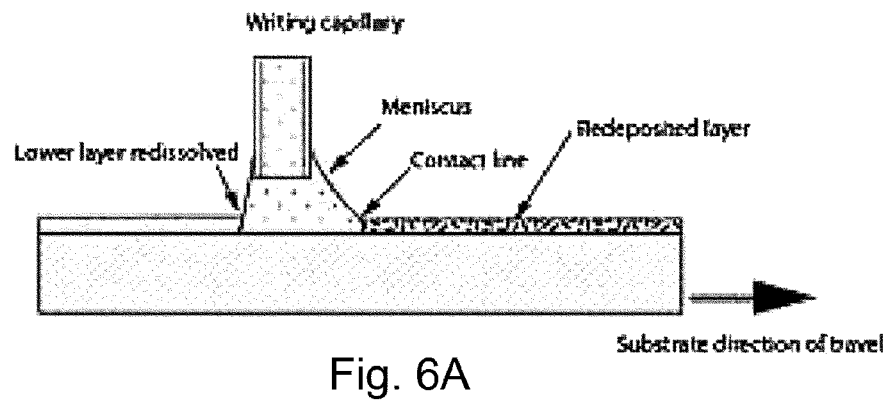
FIG. 6A depicts an example where a second layer is deposited at a slow speed onto the first layer, causing the first layer to re-dissolved because the meniscus of the solution, also known as the "coating bead," passes over the surface slowly; the first layer is effectively incorporated into the second layer.
Figure 6B:
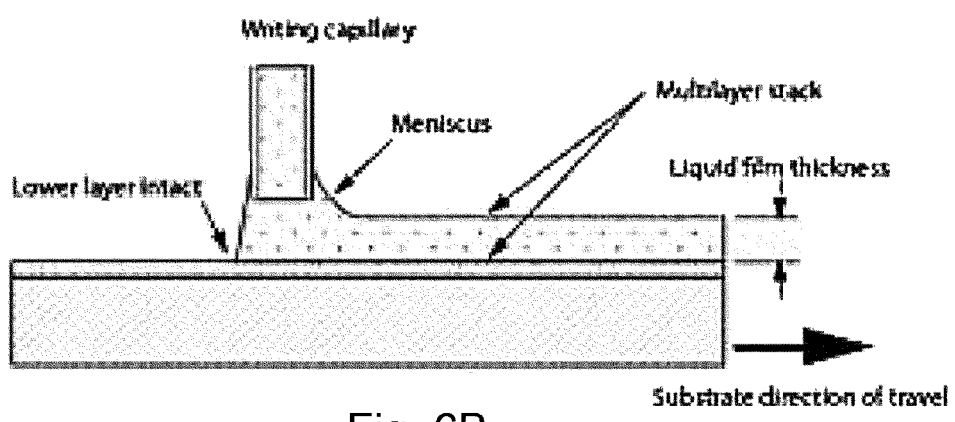
FIG. 6B depicts an example where a second film is deposited on the lower film layer on a fast time scale, thereby limiting the re-dissolving of the first layer and leaving it intact beneath the over-layer.
Figure 6C:
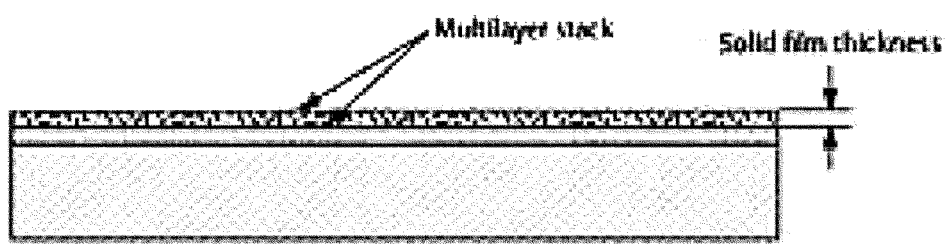
FIG. 6C depicts an exemplary multilayer stack resulting from the process depicted in FIG. 6B.

Deposition of subsequent layers without damaging the lower layers is illustrated in FIGS. 6B-6C. This is accomplished by utilizing a substrate speed that is larger than a critical velocity ($v > v_c$) in the regime where viscous forces govern the thickness of the solution layer. Once spread into a thin layer, the solution layer may partially or completely dissolve the layer below, or this effect may be negligible depending on, in an aspect, the concentration of the deposited solution relative to the solubility limit. Due to the absence of strong convection during drying under typical conditions when deposited in the LLD regime, the multilayer stack structure is preserved. Thus, nearly planar interfaces between the layers can be formed in cases where the lower layer is dissolved very little.

In other embodiments, a degree of intermixing can be introduced by choosing conditions where the lower layer is partially or completely dissolved. Controlled intermixing then occurs by diffusion at the interface between the layers during the drying process. As such, embodiments of the method may allow: (i) Deposition of a first layer using any technique. This layer may serve as a "template" layer whose purpose is to induce crystalline alignment of the over-layer, or whose composition is different so as to create a graded composition or a layered composition with sharp boundaries. (ii) Deposition of at least one over-layer in the speed regime where liquid is deposited onto the surface and dries into a film at a downstream point away from the depositing instrument. In some embodiments of the multilayer method, the concentration of the solution for an over-layer is greater than or equal to half of the solubility limit, allowing for a sharp boundary between the layers. In other embodiments, the concentration of the solution for an over-layer is less than half of the solubility limit, allowing for a graded boundary between layers (when the solvent used has the ability to dissolve the first layer). It should be noted that these examples are generalized to illustrate the concept; the concentrations of particular solute/solvent combinations may vary in the degree to which the boundary is defined.

Figure 1B:
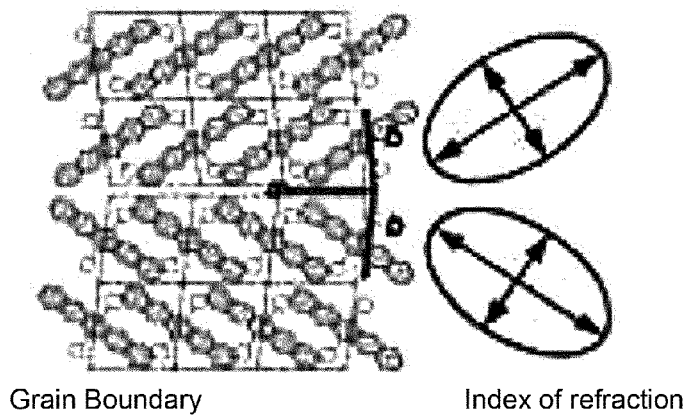
FIG. 1B is a diagram showing an exemplary molecular arrangement at a grain boundary in a thin film material
Figure 1C:
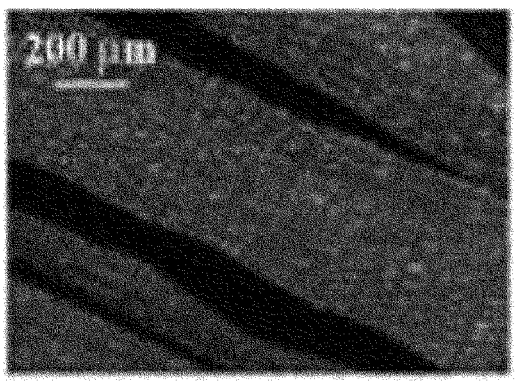
FIGS. 1C and 1D are exemplary polarization optical micrographs of 5 mm wide 6,13-Bis(triisopropylsilylethynyl)pentacene films deposited on silicon, showing contrast reversal while viewing the grain structure.
Figure 1D:

The disclosed methods produce films from small molecules and polymers. Examples of films written with a rectangular hollow capillary, 5 mm by 0.5 mm inner cross section, are shown in FIGS. 1A and 1B Films can also be written with round capillaries or other capillary implements known in the art. The methods have the advantages of being low temperature processes for depositing thin films on arbitrary substrates, including glass, silicon, metal, and plastics such as Polyethylene terephthalate (PET). The substrate does not need to be crystalline. The substrate may be made from one or more materials, and may have one or more layers of the same or different materials. Embodiments of the disclosed methods have been shown to produce large crystalline grain sizes such as >1 mm along the writing direction, and 0.1 to 0.5 mm transverse to the writing direction using a relatively easy process for many soluble small molecules. (see, e.g., FIGS. 1C and 1D).

Note that the present disclosure distinguishes between depositions of molecules from solution, towards which the disclosed methods have relevance, and the deposition of slurries, or inks composed mainly of suspended particles with solid content greater than 50%, referred to herein as "pastes." Pastes include, for example silver inks used for contact layers. These layers can be deposited by conventional means such as screen printing without dissolving underlying layers, due to the large solid content and the relative flexibility of choosing solvents for particle suspensions, where the solvent can be chosen to avoid elution of the underlying layers. Therefore, in some embodiments the solution is not a paste.

Films formed by the methods disclosed herein can have a variety of thicknesses. In an embodiment, a film thickness is between 1 molecular layer and 1 micron, inclusive. In an embodiment, the interface between the crystalline film and under layer, or substrate, is planar.

Exemplary Production Processes

Methods of the present disclosure can be utilized with a number of existing continuous or discontinuous deposition techniques. Continuous deposition techniques include but are not limited to spin coating, doctor blade coating, gravure coating, dip coating, slot-die coating, spray coating, meyer-bar coating, and hollow capillary writing. Discontinuous deposition techniques include, but are not limited to, ink jet printing, gravure printing, and screen-printing, as well as combinations of the above and/or related technologies.

In the case of multilayer stack coating it may be desirable to use coating methods such as slot-die coating, gravure, flexo, or screen printing. Such methods may address issues related to currents set up at the edges of solution droplets during the drying process. Edge currents, leading to, for example, the "coffee ring effect," can cause mixing, which can impact the integrity of the layers in the stack.

Hollow capillary writing and slot-die coating, which both inherently involve direct application of relatively thin solution layers (e.g., 1 to 250 microns, including all integer micron values and ranges therebetween) with controllable concentration and speed, may be used in some embodiments of the method. In these processes, solution is delivered through a capillary, slot, or channel directly to the surface of a substrate in relative motion where viscous forces pull the solution into a thin layer. These processes can run at high velocity, up to at least 1000 m/min, making them suitable for high-throughput production of multilayers stacks for electronic devices. In addition, methods such as spray coating and gravure coating can be adapted to deposit solution into a relatively continuous liquid layer (possibly with direct patterning on the 100 micrometer scale or larger), thus avoiding the difficulties related to edge current mixing during the drying step described above. These are additional embodiments of the process, emphasizing that a continuous liquid layer is to be formed before the drying step. It is also possible to combine these deposition steps with other patterning steps, either deposition of patterned sacrificial layers before the film deposition process, or by patterning of the layers by a subtractive process afterwards.

While some embodiments of the invention include at least two different layer coatings (e.g., "template" layer plus at least one over-layer) with a drying step between each, there are also situations where one or both deposition steps include multiple liquid layers being deposited simultaneously. Standard methods, such a multiple-slot-die, curtain coating or slide coating in at least one of the deposition steps of the present method can accomplish this. One example is where a vertically graded concentration profiles between at least two materials is desired. Then the template layer can be a thin layer of a single composition, while the over-layer can be deposited as a multilayer with gradually varying composition. Another example is where one layer is desired to have a graded composition perpendicular to the film surface, while the other layer is desired to have a sharp compositional boundary with the first.

As described in this disclosure, other methods, including, but not limited to, roll-to-roll processes such as slot-die coating, can be adapted according to the present disclosure. Such adaptation allows for producing films with large widths of up to 3000 mm or more, or structures such as, for example, arrays of stripes, each stipe having a size of 1 mm to 3000 mm or more. Adaptations of gravure or flexographic printing can produce finer patterns. Lines can be made discontinuous by raising or lowering the capillary to begin/end the line. Line widths achievable with hollow capillaries may span from 20 nanometers up to 25 millimeters dependent only on the limits in fabricating capillaries, and not by the limits of the disclosed methods. In an embodiment, the solution is deposited in a manner such that the resulting crystalline film is patterned. The present methods are direct-write processes, in which patterns can be directly written onto a surface. This reduces the number of patterning steps needed to produce structures for, as an example, organic electronic devices. Also, methods of the present disclosure are not limited to planar substrates. Curved or flexible substrates can also be used.

Figure 13:
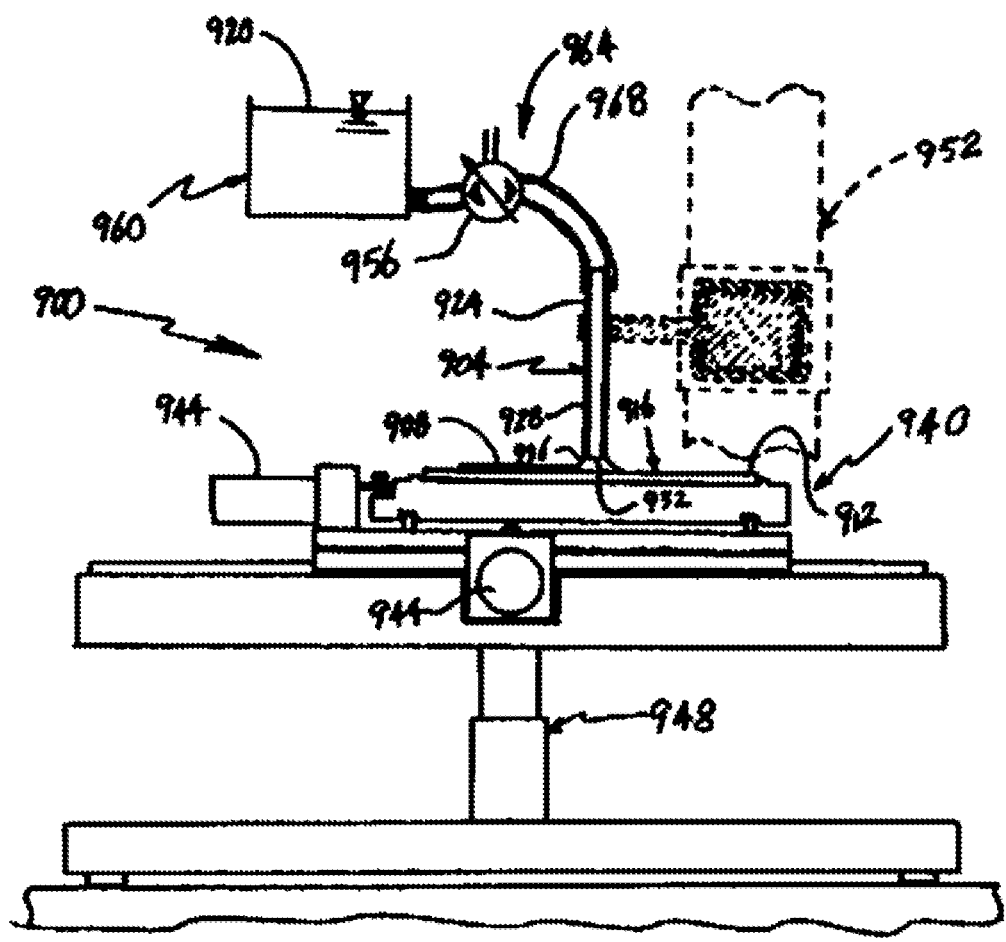
FIG. 13: Exemplary implementation of hollow capillary writing.
Figure 14A:
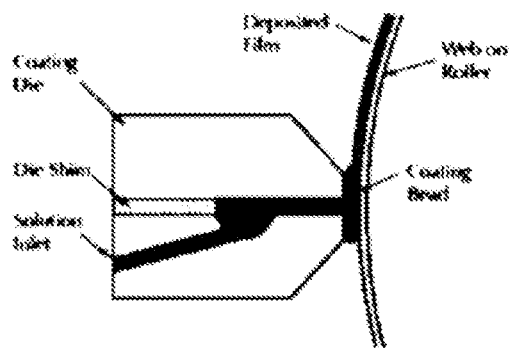
FIG. 14A-14B: Exemplary implementation of slot-die coating. (14A) Coating onto a web as it is passing over a roller in a roll-to-roll process. (14B) A typical die shim used for coating a striped pattern.
Figure 14B:
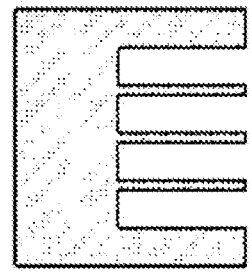
Figure 15:
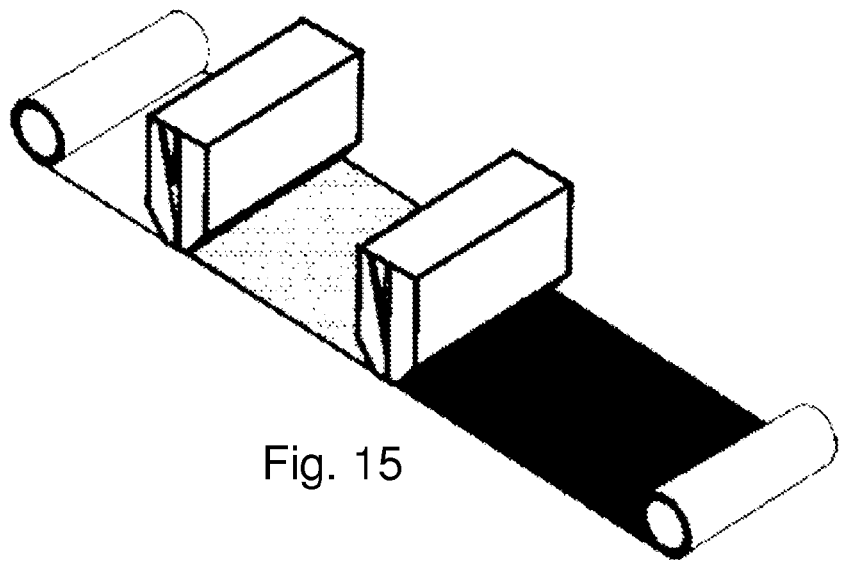
FIG. 15: Exemplary schematic of a single-pass roll-to-roll process. Two slot die coaters are illustrated, each depositing a single layer with a drying step between the two coating steps.

FIG. 13 is a diagram of a hollow capillary writer. This apparatus is capable of writing a single layer film onto a substrate in one pass. Writing multiple film layers is accomplished in multiple passes. FIGS. 14A-14B shows a typical implementation of a die for slot-die coating. FIG. 15 is a diagram for a roll-to-roll process that can deposit multiple layer in one pass with high throughput. Some cases will require large crystalline grain structure or molecular scale ordering.

Previous work has shown how to produce, for example, production of complete solar modules in a roll-to-roll process. But significantly, only a single semiconductor layer has been contemplated to be printed because it was assumed that coating a second layer would damage the underlying layers. The production process illustrated in FIG. 15, along with the methods of the present disclosure, solves this problem, allowing for multiple layer production in a high throughput process.

In an embodiment, the method is carried out using a roll-to-roll production process.

Applications

This method will find applications related to organic electronics, including fabrication of layers for organic field effect transistors, organic light emitting diodes, and organic photovoltaics. Control of nanomorphology within mixed layers is of particular interest in organic photovoltaic structures. When two materials are mixed but phase separate into a bi-continuous BHJ structure with lateral length scales in the nanometer range, the materials have an improved efficiency for charge collection due to the short path for excitons to reach the interfaces between the two materials. This type of structure can be optimized using the methods disclosed herein by grading the composition from donor-rich near one electrode of the device to acceptor-rich near the other electrode.

Examples of general structures that may comprise one or more of the instant films include electronic devices, devices controlling the flow of electrical current, devices producing light output, or devices generating electrical current, such as devices comprising a photovoltaic junction (e.g., a photo-diode).

In an embodiment, the structure is field-effect transistor that includes a substrate, a dielectric layer, an active semiconductor layer to serve as the "channel", and multiple metallic contacts, where the active semiconductor layer is a film disclosed herein or made by a method disclosed herein. In another embodiment, a device comprises such a field-effect transistor.

In an embodiment, the structure is a planar diode (e.g., light-emitting diodes and photodiodes) that includes a substrate, two semiconducting layers to serve as upper and lower n-type and p-type layers forming a rectifying p-n junction, and upper and lower metallic contacts, where the two semiconducting layers are complementary n-type and p-type films disclosed herein or made by a method disclosed herein. In another embodiment, a device comprises a planar diode.

In an embodiment, the structure is a bipolar transistor that includes a substrate, three semiconductor layers in either a n-p-n or p-n-p configuration, and three metallic contact serving as emitter, collector, and base contacts, where the n-type and p-type layers are films disclosed herein or made by a method disclosed herein. In another embodiment, a device comprises a bipolar transistor.

EXAMPLE 1

Single Layer with Improved Charge Carrier Mobility

Figure 7A:
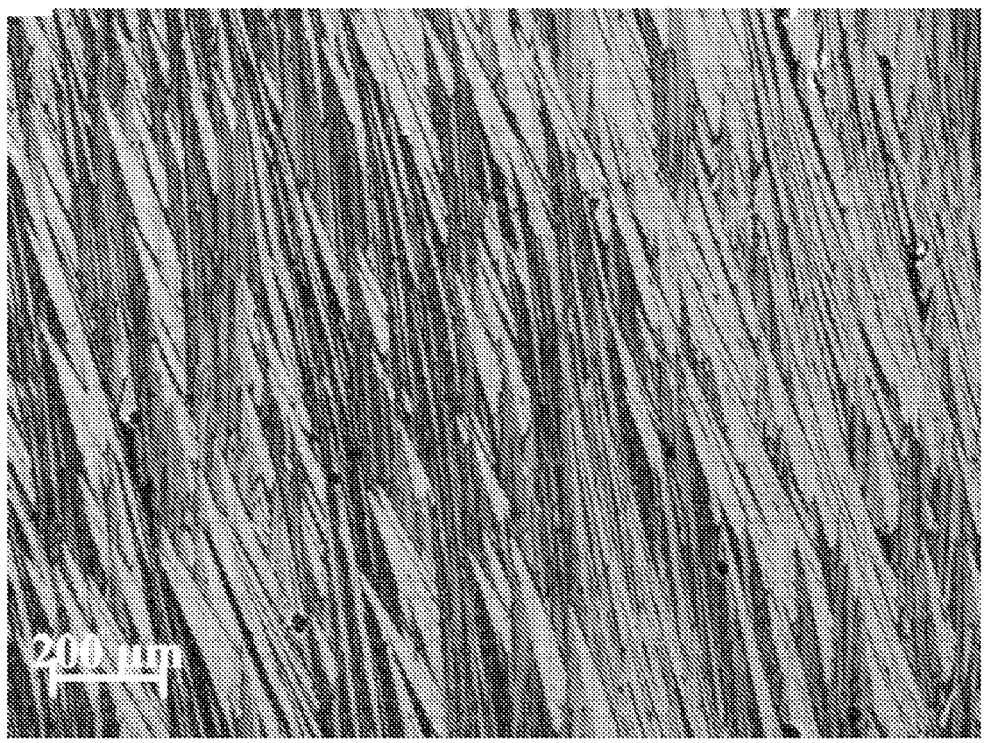
FIG. 7A-7B: Elongated grains with lengths of about 200 microns are obtained for deposition with 0.9 wt. % solution written at 90° C., and 2.2 mm/s (7A). Field effect mobility of organic thin film transistors made with TIPS-pentacene at 0.9% concentration in toluene at 90° C. (7B). The speed was varied between 0.8 mm/s and 4.0 mm/s A pronounced peak in the mobility is observed at 2.2 mm/s, indicating optimal film morphology and structure. These results illustrate that superior electronic properties can be obtained at higher writing speeds with a heated substrate. In comparison, very low mobility (<0.1 cm$^2$/V-s) is obtained over this range of writing speeds for films deposited at room temperature.
Figure 7B:
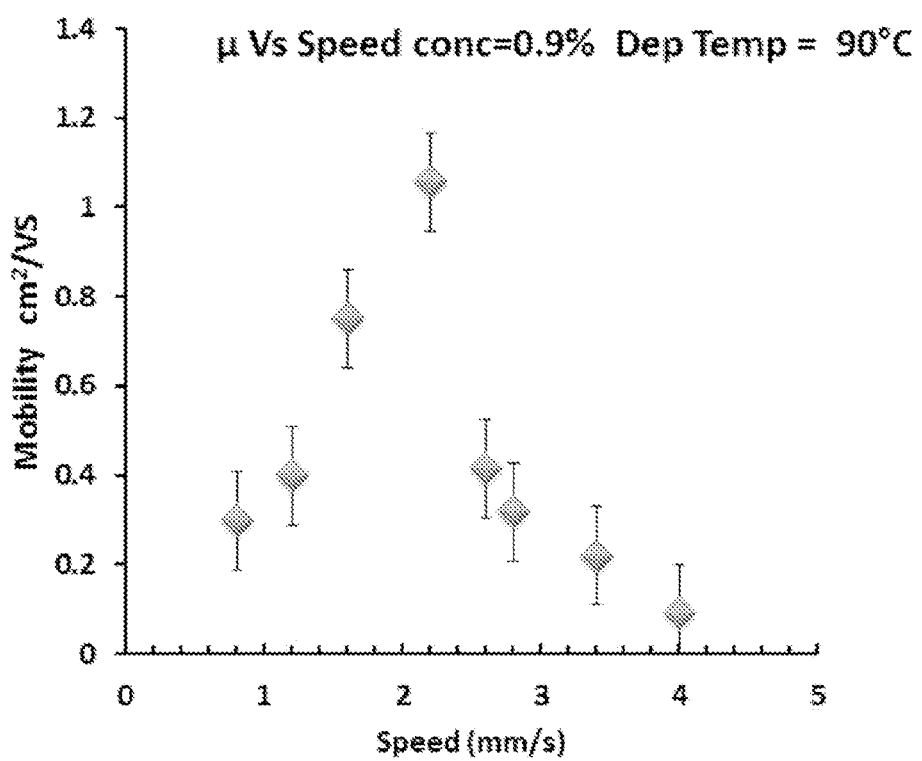

An example of a film having large crystalline grain size, and deposited with at a high speed is provided in FIG. 7A, showing a film produced by deposition on a heated substrate. In this case the convective regime is shifted to higher speed so that elongated grains can be obtained at a speed of 2.2 mm/s compared to room temperature deposition where elongated grains are obtained for v<0.2 mm/s FIG. 7B shows transistor mobility results for films deposited at 90° C. The peak in the mobility of 1.1 $cm^2/V$-s at 2.2 mm/s corresponds to the film structure shown in FIG. 7A. This can be compared to room temperature deposition, where mobility of <0.02 $cm^2/V$-s is typically obtained over the same range of speeds.

EXAMPLE 2

Homoepitaxy in Hollow Capillary Deposition

FIGS. 8 and 9A-9D show examples for deposition of 6,13-Bis(triisopropylsilylethynyl)pentacene (TIPS-Pentacene) from a 3 wt. % solution in toluene. First, a 5 mm wide line is written by hollow capillary coating at 0.08 mm/s Under these conditions a large grain size is readily observed in polarized optical microscopy with crossed linear polarizers. Then a second line of the same solution is written over the first at 25 mm/s. The second line is oriented at 90 degrees to the first, crossing over it. FIG. 8 shows a still image after deposition of the second layer. It is seen that the second layer has a much smaller grain size in the region where it does not overlap with the first. However in the region of overlap the grain structure of the second layer is observed to take on the same overall structure as the underlying layer. This shows that epitaxial overgrowth is possible in solution processing.

In FIGS. 9A-9D selected frames from video microscopy in polarization mode show the crystallization process at several stages: (9A) when the upper layer is still in the liquid phase it is nearly transparent and the lower layer is clearly visible; (9B) minor erosion of the bottom layer is observed on a time scale of less than one second, but the layer stabilizes and then in (9C) crystallization of the upper layer is observed, covering about 50% of the visible area. In (9D) the crystallization process is observed to be complete, and the grain structure is observed to be the same as the lower layer. The whitish appearance is due to the final film thickness, which is double the original thickness.

EXAMPLE 3

Multilayers of Complementary Materials

Figure 10:
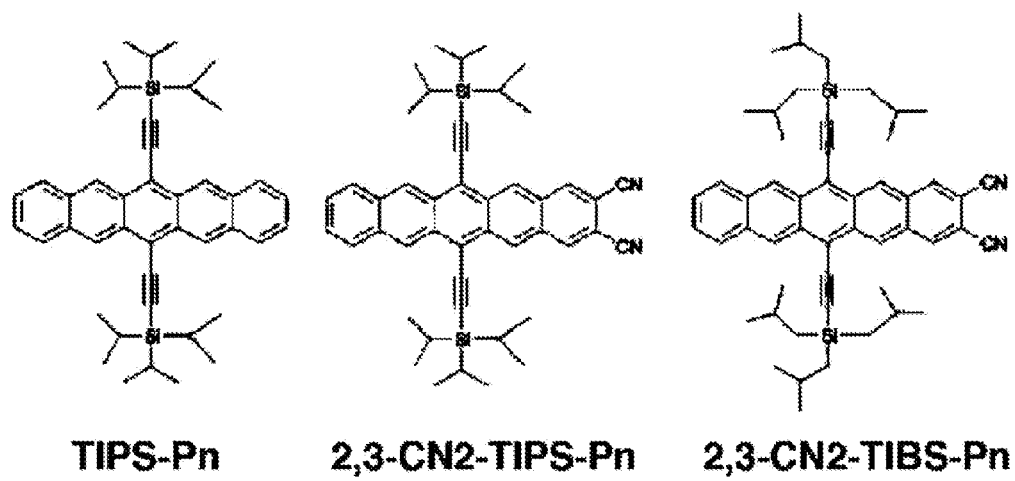
FIG. 10: Molecular structure of several compounds based on Pentacene (Pn). TIPS-Pn is a p-type semiconductor in solid form. Both 2,3-CN2-TIPS-Pn and 2,3-CN2-TIBS-Pn are n-type semiconductors.

FIG. 10 shows the molecular structures of 6,13-bis(triisopropyl-silylethynyl)pentacene (left), 2,3-Dicyano-6,13-bis-(triisopropylsilylethynyl)pentacene (middle), and 2,3-Dicyano-6,13-bis-(triisobutylsilylethynyl)pentacene (right). Both of the cyano-pentacene molecules pack into 2D brickwork structures similar to the 2D pi-stacked crystalline structure of TIPS-pentacene. This makes all three materials good candidates for forming epitaxial multilayers with each other.

Particularly interesting combinations include multilayers with complementary p-type/n-type layer combinations such as TIPS-Pn/2,3-CN2-TIPS-Pn or TIPS-Pn/2,3-CN2-TIBSPn. Complementary semiconductor materials can be combined to form transistor gate logic, diodes, or photovoltaic junctions. However, because the molecules are similar, they do not readily phase separate, and so previous approaches (such as formation of a bulk heterojunction, which relies on nanometer scale phase separation) would not be easily achievable with this combination of materials. The approach described in this disclosure is to sequentially form several stacked layers, thus forming planar, graded, or nanostructured multilayers.

Figures 11A, 11B:
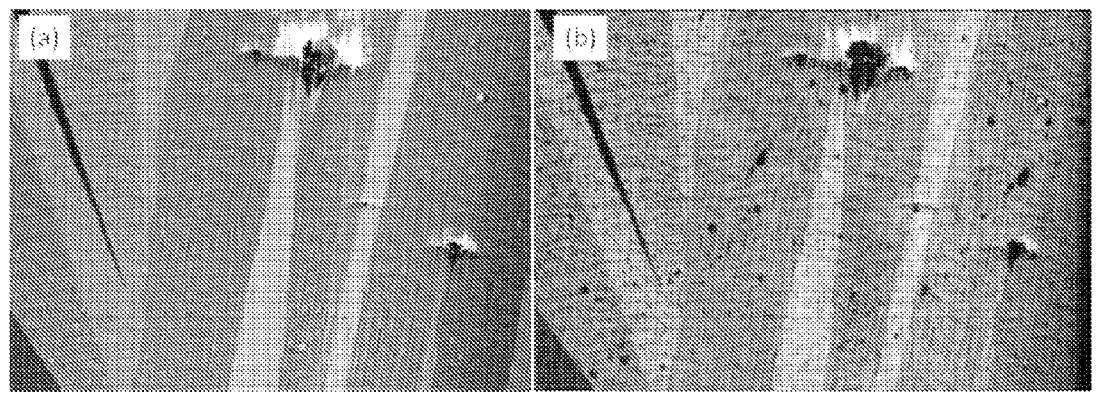
FIG. 11A-11D: Crystallization of 2,3-CN2-TIBS-Pn on TIPS-Pn. Frame (11A) shows layer #1 under crossed polarizers. In frame (11B), the surface has already been coated with a thin layer of 2,3-CN2-TIBS-Pn solution, which is nearly transparent. Minimal elution of layer #1 occurs while layer #2 remains in a liquid state. Frame (11C) shows the transition of layer #2 to a crystalline state. The crystallized material is visible as a lighter shade encroaching from the top left of the image. Frame (11D) shows the final structure after complete crystallization of layer #2. The field of view in each frame is 2 mm horizontally.
Figures 11C, 11D:
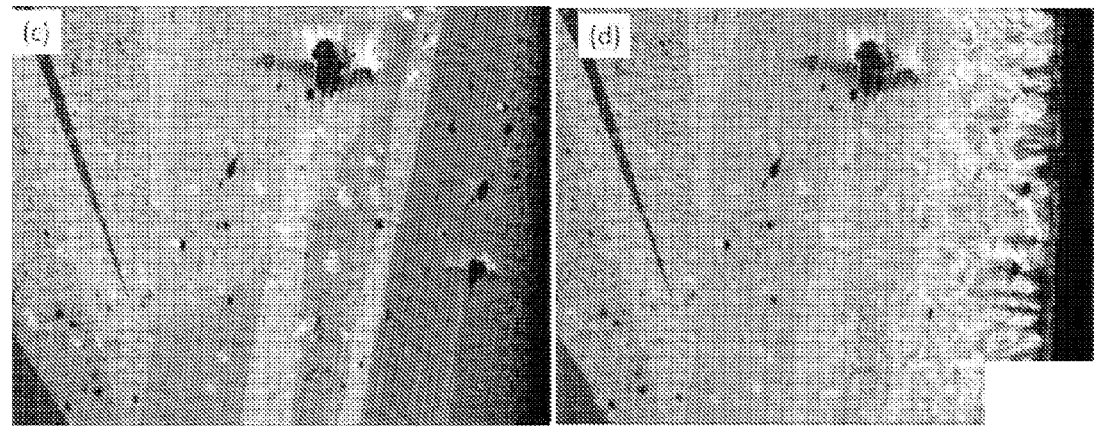

FIGS. 11A-11D shows an example of a multilayer consisting of a first layer deposited from a 6 wt. % solution of TIPS-Pn deposited at 0.08 mm/s forming a large grain structure film, and a second layer of 6 wt. % 2,3-CN2-TIBS-Pn deposited at 12 mm/s. An image of the first layer film taken with crossed polarizers is shown in FIG. 11A. FIGS. 11B-11C show frames from a movie of the crystallization of the second layer, spanning about 3 seconds total. In FIG. 11B the second layer is still in a liquid state, so that the first layer is clearly visible. Some small holes develop, indicating minor damage to the first layer. FIG. 11C shows the beginning of the crystallization event, as the lighter shade sweeps through from the top left of the image. Homogeneous nucleation of crystals ahead of the main crystallization front is an indication that the second layer has reached a high degree of supersaturation before crystallizing. In this context, homogeneous nucleation implies that the lower layer is not acting as an epitaxial template. FIG. 11D shows the final structure. A small grain structure is observed for the second layer and it is not well aligned to the first layer. These observations taken together suggest that, although the substrate structure survives almost undamaged, the second layer does not form an aligned epitaxial layer.

Figure 12A:
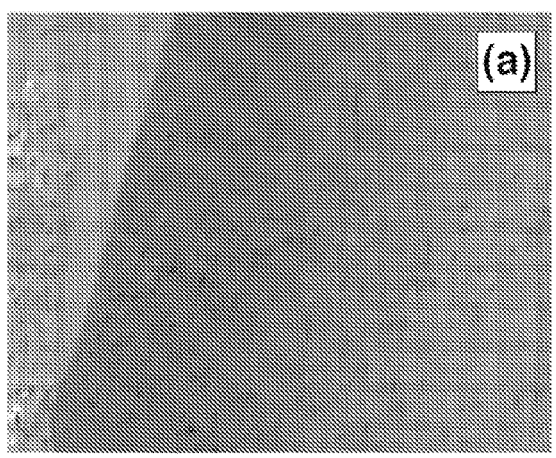
FIG. 12A-12D: Crystallization of 2,3-CN2-TIPS-Pn on TIPS-Pn. Frame (12A) shows layer #1 under crossed polarizers before deposition of the second layer. In frame (12B), the surface has been coated with a thin layer of 2,3-CN2-TIPS-Pn solution, which is nearly transparent. Frame (12C) shows the transition of layer #2 to a crystalline state. The crystallized material is visible as a darker shade encroaching from the top of the image. Frame (12D) shows the final structure after complete crystallization of layer #2. The field of view in each frame is 1 mm horizontally.
Figure 12B:
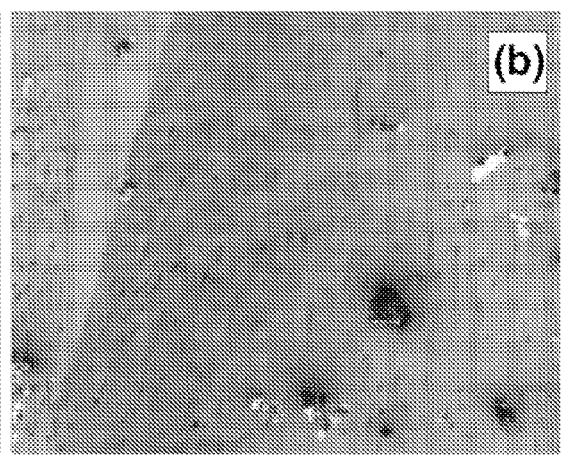
Figure 12C:
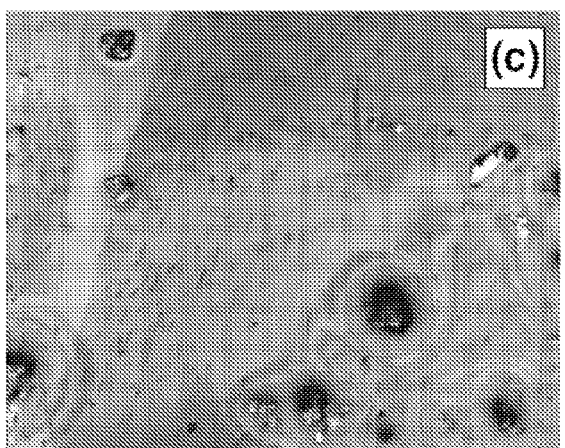
Figure 12D:
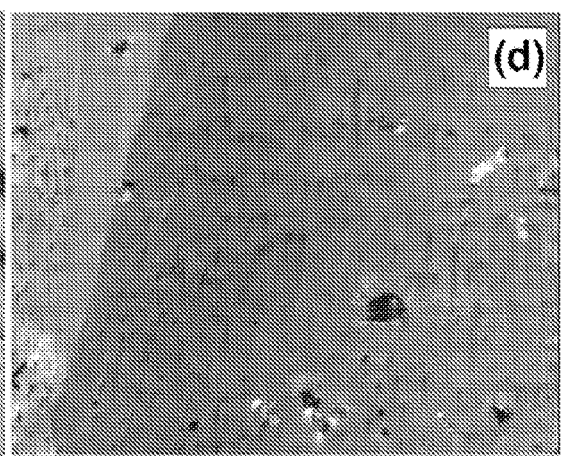

FIGS. 12A-12D shows an example of a multilayer consisting of a first layer of a 6 wt. % solution of TIPS-Pn deposited at 0.08 mm/s forming a large grain structure film, and a second layer of 6 wt. % 2,3-CN2-TIPS-Pn deposited at 12 mm/s. The first layer grain structure is shown in FIG. 12A. FIG. 12B shows the surface just after the second layer has been applied. The 6 wt. % 2,3-CN2-TIPS-Pn in toluene forms a saturated solution, and some un-dissolved material is visible (the solution was not filtered prior to the deposition). No damage to the first layer is visible in this case, due to the second layer being a highly saturated solution and therefore, not being able to dissolve additional material. In FIG. 12C the crystallization of the second layer is underway, visible as a darker shade sweeping down from the top of the image. In FIG. 12D crystallization of the second layer is complete. The grain structure is the same as the underlying template layer, and there is no evidence for homogeneous nucleation as was observed in FIGS. 11A-11D for 2,3-CN2-TIBS-Pn. Thus, the results for 2,3-CN2-TIPS-Pn are superior in terms of achieving aligned epitaxial growth.

The differences between the results obtained for cyanopentances in FIGS. 11A-11D versus in FIGS. 12A-12D can be understood in terms of their structure. FIG. 10 shows that the 2,3-CN2-TIPS-Pn molecule is closer in structure to TIPS-Pn because they have the same TIPS side groups at the 6 and 13 positions. This similarity along with the similarity of the crystalline packing promotes aligned overgrowth in this system. On the other hand 2,3-CN2-TIBS-Pn has bulkier TIBS side groups, which changes the volume of the crystalline unit cell making aligned overgrowth more difficult to achieve. The effect is analogous to the effect of lattice matching observed in inorganic heteroepitaxy, where lattice constants of two materials match to within a few percent resulting in highly oriented growth with a coherent interface structure.

EXAMPLE 4

Figure 16:
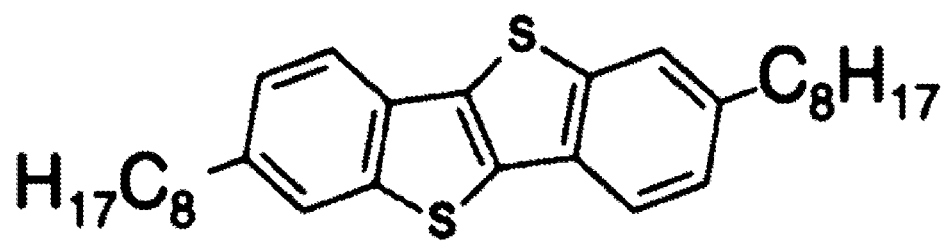
FIG. 16 is a diagram showing the molecular structure of C8-BTBT.
Figure 17A:
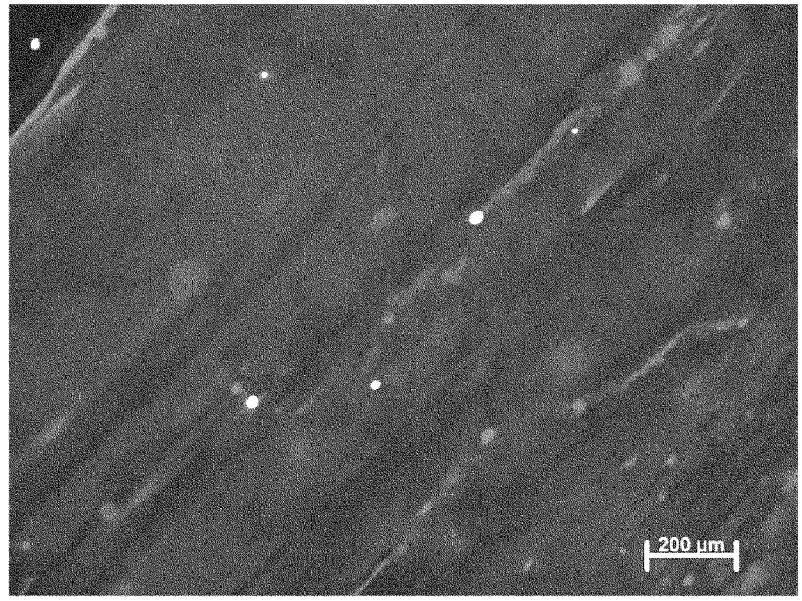
FIG. 17A is a polarized optical microscope image of a ~1 mm wide region of a C8-BTBT thin film written from a 1 wt. % solution in toluene at a writing speed of 1 mm/s.
Figure 17B:
FIG. 17B is a polarized image of the same region of the film of FIG. 17A, rotated by 45 degrees (relative to the image of FIG. 17A), showing extinction due to polarization contrast and showing that a single crystalline grain fills the entire area visible in the image.
Figure 18A:
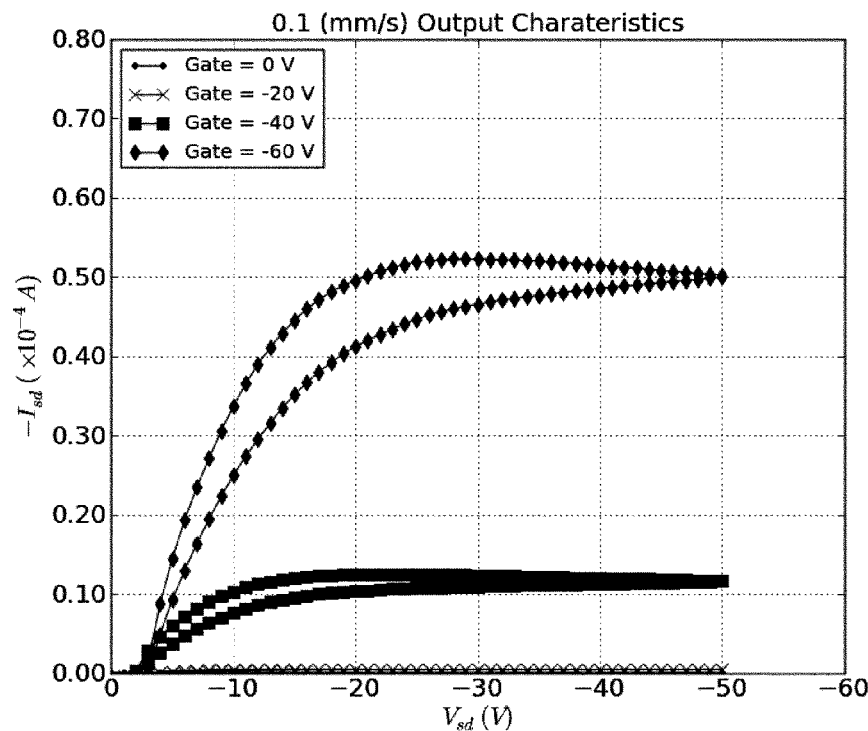
FIG. 18: Example of C8-BTBT Organic Field Effect Transistor characteristics. (left) Output characteristics; (right) transfer characteristics. Devices were fabricated with an $SiO_2$ dielectric and gold source and drain contacts in a top contact geometry. Channel length (width) are 100 (1000) micrometers. This exemplary device was fabricated from a film written from a 1 wt. % solution in toluene at 0.1 mm/s. The carrier mobility determined from the transfer curve is 5.0 $cm^2$/V-s.
Figure 18B:
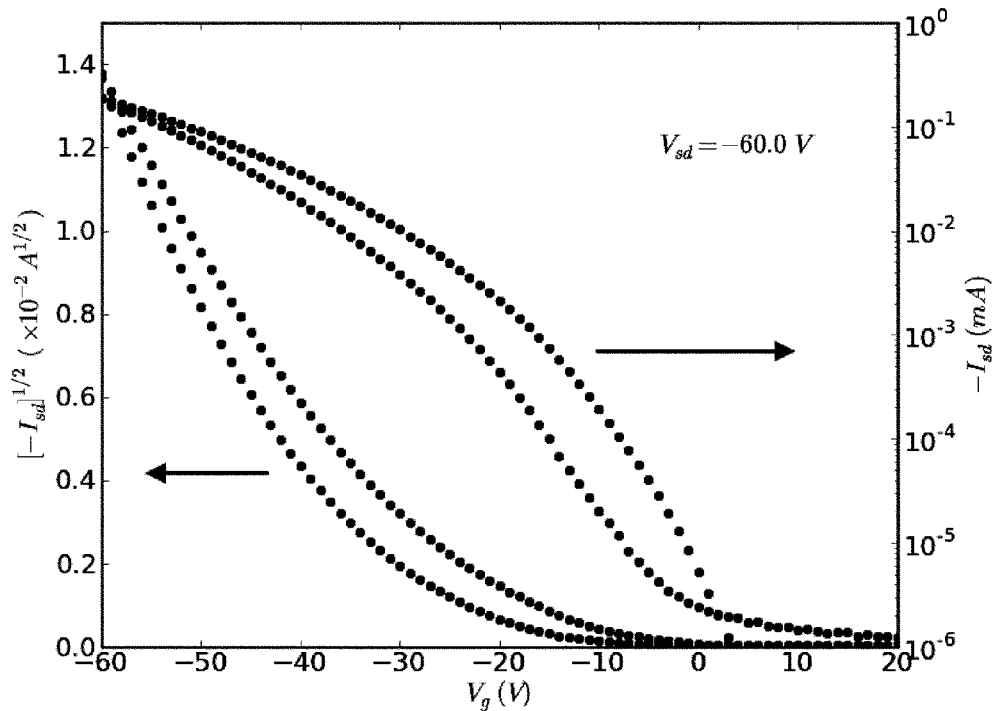

2,7-dioctyl[1]benzothieno[3,2-b][1]benzothiophene (C8-BTBT) Thin Films 2,7-dioctyl[1]benzothieno[3,2-b][1]benzothiophene (structure shown in FIG. 16) thin films deposited by the pen-writer method exhibit high crystallinity. The films crystallized along the writing direction in the convective speed regime, up to a critical speed of 2 mm/s. The grain size and grain orientation were determined by polarized optical microscopy (FIG. 17). Organic field effect transistors fabricated from these films have carrier mobility ranging up to 5.0 $cm^2/V$-s (FIG. 18).

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A method for forming a crystalline film of a material, comprising the steps of:
    depositing a solution comprising precursor molecules on a substrate including a base film disposed thereon, wherein the base film is a template crystalline film, the solution having a base critical speed between a convective regime and an LLD regime, such that a crystalline film is formed;
    wherein the solution is deposited at a speed greater than the base critical speed and the crystalline film has a crystal structure characteristic of a crystalline film formed from the solution at a deposition speed less than the base critical speed.

2. The method of claim 1, wherein the substrate has one or more layers and the solution is deposited on an outermost layer.

3. The method of claim 1, wherein the solution has a concentration of 0.01 wt. % to 50 wt. %.

4. The method of claim 1, wherein the substrate has a temperature greater than 0° C.

5. The method of claim 1, wherein the precursor molecules are selected from the group consisting of 6,13-bis(triisopropylsilylethynyl)pentacene (TIPS pentacene), Dicyano-6,13-bis-(triisopropylsilylethynyl)pentacene (2,3-CN2-TIPS-Pn), 2,7-dioctyl[1]benzothieno[3,2-b][1]benzothiophene (C8-BTBT), poly(3-hexylthiophene) (P3HT), and 1-(3-methoxycarbonyl)propyl-1-phenyl[6,6]C61 (PCBM).

6. The method of claim 1, wherein the crystalline film has crystalline domains having a size greater than those of a crystalline film formed by the solution at a deposition speed less than the base critical speed.

7. A device comprising:
    a crystalline film made by the method of claim 1; and
    one or more electrical leads in electrical communication with the crystalline film.

8. A method for forming a crystalline film on a base film disposed on a substrate, comprising the steps of:
    depositing a solution comprising precursor molecules on the base film, wherein the base film is a template crystalline film, wherein the solution has a critical speed between a convective regime and an LLD regime and the solution is deposited at a speed greater than or equal to the critical speed, such that a crystalline film is formed on the base film.

9. The method of claim 8, wherein a solvent of the solution is selected such that the base film will at least partially dissolve during deposition of the solution.

10. The method of claim 9, wherein the base film comprises a material different from a material of the epitaxial crystalline film formed by the solution.

11. The method of claim 10, wherein the solution is deposited at a speed such that the base film and crystalline film form a layer having a graded composition.

12. The method of claim 9, wherein the solution has a concentration greater than half of the solubility limit of the precursor molecules.

13. The method of claim 9, wherein the solution has a concentration less than or equal to half of the solubility limit of the precursor molecules.

14. The method of claim 9, wherein the precursor molecules are selected from the group consisting of 6,13-bis(triisopropylsilylethynyl)pentacene (TIPS pentacene), Dicyano-6,13-bis(triisopropylsilylethynyl)pentacene (2,3-CN2-TIPS-Pn), 2,7-dioctyl[1]benzothieno[3,2-b][1]benzothiophene (C8-BTBT), poly(3-hexylthiophene) (P3HT), and 1-(3-methoxycarbonyl)propyl-1-phenyl[6,6]C61 (PCBM).

15. The method of claim 8, wherein the crystalline film is an epitaxial crystalline film.

16. A device comprising:
    a crystalline film made by the method of claim 8; and
    one or more electrical leads in electrical communication with the crystalline film.

* * * * *